(12) United States Patent
Hong et al.

(10) Patent No.: US 11,665,939 B2
(45) Date of Patent: May 30, 2023

(54) DISPLAY DEVICE

(71) Applicant: LG Display Co., Ltd., Seoul (KR)

(72) Inventors: Mookyoung Hong, Paju-si (KR); Hyerim Kim, Paju-si (KR); Juwon Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 341 days.

(21) Appl. No.: 17/124,131

(22) Filed: Dec. 16, 2020

(65) Prior Publication Data
US 2021/0202660 A1    Jul. 1, 2021

(30) Foreign Application Priority Data

Dec. 27, 2019 (KR) .......................... 10-2019-0176986
Dec. 31, 2019 (KR) .......................... 10-2019-0179717

(51) Int. Cl.
*H01L 27/32* (2006.01)
*H05K 1/18* (2006.01)

(52) U.S. Cl.
CPC ........ *H01L 27/3276* (2013.01); *H01L 27/326* (2013.01); *H05K 1/18* (2013.01); *H05K 2201/04* (2013.01); *H05K 2201/10128* (2013.01)

(58) Field of Classification Search
CPC .......................... H01L 27/3276; H01L 27/326
See application file for complete search history.

(56) References Cited

U.S. PATENT DOCUMENTS

| | | | |
|---|---|---|---|
| 2014/0232275 | A1 | 8/2014 | Kwon et al. |
| 2018/0096649 | A1 | 4/2018 | Lee et al. |
| 2018/0151117 | A1 | 5/2018 | Choi et al. |
| 2018/0151119 | A1 | 5/2018 | Lee et al. |

FOREIGN PATENT DOCUMENTS

| | | |
|---|---|---|
| CN | 104008722 A | 8/2014 |
| CN | 108122532 A | 6/2018 |
| TW | 201824238 A | 7/2018 |

*Primary Examiner* — Douglas M Menz
(74) *Attorney, Agent, or Firm* — Seed IP Law Group LLP

(57) ABSTRACT

The present disclosure relates to a display device capable of preventing light-emitting elements in a display panel from being deteriorated. A power supply circuit includes a plurality of first power supply lines each of which extends in a first direction and a plurality of second power supply lines each of which extends in a second direction intersecting the first direction, in which the second power supply lines are electrically connected with the first power supply lines.

18 Claims, 29 Drawing Sheets

DISPLAY DEVICE

CROSS REFERENCE(S) TO RELATED APPLICATIONS

This application claims the benefit of Korean Patent Application No. 10-2019-0179717 filed on Dec. 31, 2019, and Korean Patent Application No. 10-2019-0176986 filed on Dec. 27, 2019, the entire contents of which is incorporated herein by reference for all purposes as if fully set forth herein.

BACKGROUND

Technical Field

The present disclosure relates to a display device. More particularly, the present disclosure relates to a display device providing a uniform display quality.

Description of the Related Art

Various display devices are being developed for multimedia devices such as televisions, mobile phones, tablet computers, navigation systems, or gaming devices.

A display device includes a display panel in which light-emitting elements illuminate by receiving a power supply voltage from a power module.

When the power supply voltage is supplied to the display panel, the amount of heat generated in the display panel may vary depending on regions. Therefore, the light-emitting elements in the regions generating more heat are deteriorated, or the display quality of the display panel becomes uneven.

BRIEF SUMMARY

An objective of the present disclosure is to provide a display device capable of preventing light-emitting elements in a display panel from being deteriorated.

Another objective of the present disclosure is to provide a display device having an overall uniform display quality.

According to one embodiment, a display device includes: a display panel including a display region and a non-display region defined around the display region; and a main circuit board transferring a power supply voltage to the display panel. The display panel may include multiple pixels and a power supply circuit electrically connected to the multiple pixels. The power supply circuit may include: a plurality of first power lines, each of which extends in a first direction; and a plurality of second power lines, each extending in a second direction intersecting the first direction, in which the second power lines are electrically connected to the first power lines. The power supply circuit includes a first portion spaced apart from the main circuit board by a first distance and a second portion spaced apart from the main circuit board by a second distance longer than the first distance, the first portion having a first density of the first power lines and/or of the second power lines and the second portion having a second density of the first power lines and/or of the second power lines. Namely, the first portion can have a first density of either the first power lines or the second power lines or both.

In one embodiment, at least a portion of the power supply circuit may overlap the display region of the display panel.

In one embodiment, each of the plurality of pixels includes a light-emitting element, and the power supply circuit may supply a power supply voltage to the light-emitting element.

In one embodiment, the plurality of first power lines may include: a first line having a first length and being spaced apart from the main circuit board by a third distance; and a second line having a second length longer than the first length and being spaced apart from the main circuit board by a fourth distance longer than the third distance.

In one embodiment, the length of each of the first power lines may gradually increase or decrease with a distance from the main circuit board.

In one embodiment, a plurality of openings may be defined within the power supply circuit, and the plurality of openings may include a first opening and a second opening. The first opening may have a first size and be spaced apart from the main circuit board by a fifth distance. The second opening may have a second size larger than the first size and be spaced apart from the main circuit board by a sixth distance longer than the fifth distance.

In one embodiment, a plurality of openings may be defined within the power supply circuit, and the size of each of the plurality of openings may gradually increase or decrease with a distance from the main circuit board.

In one embodiment, the display device may further include a plurality of data circuit boards disposed on one side of the display panel and electrically connected to the main circuit board, in which the power supply voltage provided by the main circuit board may be transferred to the display panel through at least one of the plurality of data circuit boards.

According to one embodiment, the display device may include a display panel, a plurality of data circuit boards, a plurality of data driving circuits, a plurality of sub-circuit boards, and a main circuit board. The display panel may include a display region, a non-display region defined at a periphery portion of the display region, a plurality of pixels, and a power supply circuit that transfers a power supply voltage to the plurality of pixels. Each of the plurality of data circuit boards may be disposed on one side of the display panel and may be electrically connected to the display panel. Each of the plurality of data driving circuits may be mounted on a corresponding one of the plurality of data circuit boards and may supply a data signal to the plurality of pixels. Each of the plurality of sub-circuit boards may be electrically connected to a corresponding one of the plurality of data circuit boards. The main circuit board may supply the power supply voltage to the power supply circuit through at least one of the plurality of sub-circuit boards and at least one of the plurality of data circuit boards. The plurality of data circuit boards may include a first data circuit board and a second data circuit board. The first data circuit board may include i pads through which the power supply voltage is transferred from the main circuit board to the power supply circuit and may be spaced apart from the main circuit board by a first distance. The second data circuit board may include j pads (where j is a number smaller than i) through which the power supply voltage is transferred from the main circuit board to the power supply circuit and may be spaced apart from the main circuit board by a second distance shorter than the first distance.

In one embodiment, the power supply circuit may include a plurality of first power lines each of which extends in a first direction and which is arranged in a second direction intersecting the first direction and a plurality of second power lines each of which extends in the second direction and which are arranged in the first direction, the second power lines being electrically connected to the first power lines.

In one embodiment, at least a portion of the power supply circuit may overlap the display region of the display panel.

In one embodiment, the plurality of data circuit boards may further include a third data circuit board, the third data circuit board may include k pads through which the power supply voltage is transferred from the main circuit board to the power supply circuit, and may be spaced apart from the main circuit board by a third distance shorter than the second distance, and k may be a number smaller than j.

In one embodiment, the plurality of data circuit boards may further include a fourth data circuit board, the fourth data circuit board may include l pads through which the power supply voltage is transferred from the main circuit board to the power supply circuit, and may be spaced apart from the main circuit board by a fourth distance shorter than the third distance, and l is a number smaller than k.

In one embodiment, i may be 12n, j may be 6n, k may be 4n, and the l may be 3n.

In one embodiment, each of the plurality of pixels may include a light-emitting element, and the power supply circuit may supply a power supply voltage to the light-emitting element.

In one embodiment, the display device may further include a main connection circuit board electrically connecting a corresponding one of the plurality of sub-circuit boards to the main circuit board, in which the plurality of sub-circuit boards may include a plurality of edge circuit boards and a plurality of center circuit boards disposed between the plurality of edge circuit boards.

In one embodiment, the main connection circuit board may electrically connect one of the plurality of center circuit boards to the main circuit board.

In one embodiment, the main connection circuit board may electrically connect one of the plurality of edge circuit boards to the main circuit board.

According to one embodiment, a display device includes: a display panel including a display region and a non-display region defined at a periphery portion of the display region; a center temperature sensor disposed adjacent to the display panel; and a power module configured to supply a pixel driving voltage to the display panel. The display panel may include a plurality of light-emitting elements and a power supply member. When a temperature value measured by the center temperature sensor is less than a predetermined value, a first portion of the power supply member may receive electric power from the power module. When the temperature value is greater than or equal to the predetermined value, a second portion of the power supply member spaced apart from the first portion may receive electric power from the power module.

In one embodiment, the plurality of power supply lines may include a plurality of first power supply lines and second power supply lines. Each of the first power supply lines may extend in a first direction. Each of the plurality of second power supply lines extends in a second direction intersecting the first direction and may be connected to the plurality of the first power supply lines.

In one embodiment, a distance between the first portion of the power supply member and the center temperature sensor may be a first distance, and a distance between the second portion of the power supply member and the center temperature sensor may be a second distance that is longer than the first distance.

In one embodiment, the display device may further include a main circuit board, a center circuit board, and an edge circuit board. The main circuit board may be spaced apart from a first side of the display panel by a third distance. The center circuit board may be electrically connected to the main circuit board and the display panel and may be spaced apart from the first side of the display panel by a fourth distance shorter than the third distance. The edge circuit board may be electrically connected to the main circuit board and the display panel and may be spaced apart from the first side of the display panel by a fifth distance shorter than the third distance.

In one embodiment, the display device may further include an edge temperature sensor. The edge temperature sensor may be disposed on the edge circuit board, spaced apart from the first portion of the power supply member by a sixth distance, and spaced apart from the second portion of the power supply member by a seventh distance shorter than the sixth distance. The predetermined value may be a temperature value measured by the edge temperature sensor.

In one embodiment, the display device may further include a current control module. The current control module may include a current control circuit, a first control transistor, and a second control transistor. The current control circuit may receive an electrical signal corresponding to the temperature value measured by the center temperature sensor. The first control transistor may include a first control electrode electrically connected to the current control circuit, a first input electrode receiving electric power from the power module, and a first output electrode transferring the electric power received by the first input electrode to the first portion of the power supply member. The second control transistor may include a second control electrode electrically connected to the current control circuit, a second input electrode receiving electric power from the power module, and a second output electrode transferring the electric power received by the second input electrode to the second portion of the power supply member.

When the temperature value is less than the predetermined value, the first control transistor may turn on and the second control transistor may turn off. On the other hand, when the temperature value is greater than or equal to the predetermined value, the first control transistor may turn off and the second control transistor may turn on.

According to one embodiment, a display device includes: a display panel including a display region and a non-display region defined at a periphery portion of the display region; a power module configured to supply a pixel driving voltage to the display panel; and a first current measurement sensor disposed adjacent to the display panel and configured to measure the amount of current received by the display panel. The display panel may include a plurality of light-emitting elements and a power supply member. The power supply member may be electrically connected to the plurality of light-emitting elements and may include a plurality of power supply lines. When the amount of current measured by the first current measurement sensor is smaller than a predetermined amount, a first portion of the power supply member may receive electric power from the power module. On the other hand, when the amount of current is larger than or equal to the predetermined amount, a second portion of the power supply member, which is spaced apart from the first portion, may receive electric power from the power module.

In one embodiment, the plurality of power supply lines may include a plurality of first power supply lines each of which extends in a first direction and a plurality of second power supply lines each of which extends in a second direction intersecting the first direction, in which the second power supply lines are electrically connected to the first power supply lines.

In one embodiment, a distance between the first portion of the power supply member and the current measurement sensor may be a first distance, and a distance between the second portion of the power supply member and the current measurement sensor may be a second distance that is longer than the first distance.

In one embodiment, the display device may further include a second current measurement sensor. The second current measurement sensor may be spaced apart from the first portion of the power supply member by a third distance and spaced apart from the second portion of the power supply member by a fourth distance shorter than the third distance. The predetermined value may represent the amount of current measured by the second current measurement sensor.

In one embodiment, the display device may further include a current control module. The current control module may include a current control circuit, a first control transistor, and a second control transistor. The current control circuit may receive an electrical signal corresponding to the amount of current measured by the first current measurement sensor. The first control transistor may include a first control electrode electrically connected to the current control circuit, a first input electrode receiving electric power from the power module, and a first output electrode transferring the electric power received by the first input electrode to the first portion of the power supply member. The second control transistor may include a second control electrode electrically connected to the current control circuit, a second input electrode receiving electric power from the power module, and a second output electrode transferring the electric power received by the second input electrode to the second portion of the power supply member.

When the amount of current is smaller than a predetermined amount, the first control transistor may turn on and the second control transistor may turn off. On the other hand, when the amount of current is larger than or equal to the predetermined amount, the first control transistor may turn off and the second control transistor my turn on.

According to one embodiment, a display device includes: a power supply member including a plurality of power supply lines; a plurality of light-emitting elements electrically connected to the power supply member; a center circuit board spaced apart from the main circuit board by a first distance; an edge circuit board spaced apart from the main circuit board by a second distance longer than the first distance; a first main connection circuit board electrically connecting the main circuit board and the center circuit board to each other; a second main connection circuit board electrically connecting the main circuit board and the center circuit board to each other and disposed adjacent the first main connection circuit board; a sub-connection circuit board electrically connecting the center circuit board and the edge circuit board to each other; a sensor module disposed adjacent the power supply member; a first power transfer line; and a second power transfer line. The first power transfer line may be disposed on the main circuit board, the first main connection circuit board, and the center circuit board and may be electrically connected to the power supply member. The second power transfer line may be disposed on the main circuit board, the second main connection circuit board, the center circuit board, the sub-connection circuit board, and the edge circuit board, and may be electrically connected to the power supply member.

In one embodiment, the plurality of power supply lines may include a plurality of first power supply lines each of which extends in a first direction and a plurality of second power supply lines each of which extends in a second direction intersecting the first direction, in which the second power supply lines are electrically connected to the first power supply lines.

In one embodiment, a plurality of openings may be defined between the plurality of first power supply lines and the plurality of second power supply lines, and at least one of the plurality of light-emitting elements may overlap one of the plurality of openings, on a plane defined by the first direction and the second direction.

In one embodiment, the display device may further include a power module. The sensor module may include a center temperature sensor disposed on the center circuit board. When a temperature value measured by the center temperature sensor is less than a predetermined value, the power module may supply electric power to the power supply member via only the first power transfer line of the first and second power transfer lines. On the other hand, when the measured temperature value is greater than or equal to the predetermined value, the power module may supply electric power to the power supply member via only the second power transfer line of the first and second power transfer lines.

In one embodiment, the display device may further include a power module. The sensor module may include a center temperature sensor disposed on the center circuit board and an edge temperature sensor disposed on the edge circuit board. When a first temperature value measured by the center temperature sensor is less than a second temperature value measured by the edge temperature sensor, the power module may supply electric power to the power supply member via only the first power transfer line of the first and second power transfer lines. On the other hand, when the first temperature value is greater than or equal to the second temperature value, the power module may supply electric power to the power supply member via only the second power transfer line of the first and second power transfer lines.

In one embodiment, the display device may further include a power module. The sensor module may include a current measurement sensor disposed on the center circuit board. When the amount of current measured by the current measurement sensor is smaller than a predetermined amount, the power module may supply electric power to the power supply member via only the first power transfer line of the first and second power transfer lines. On the other hand, when the amount of current is larger than or equal to the predetermined amount, the power module may supply electric power to the power supply member via only the second power transfer line of the first and second power transfer lines.

In one embodiment, the display device may further include a transistor. The transistor may be electrically connected to one of the plurality of light-emitting elements, and the transistor may include a control electrode, an input electrode, and an output electrode. The input electrode and the output electrode of the transistor may be disposed in the same layer as the power supply member.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
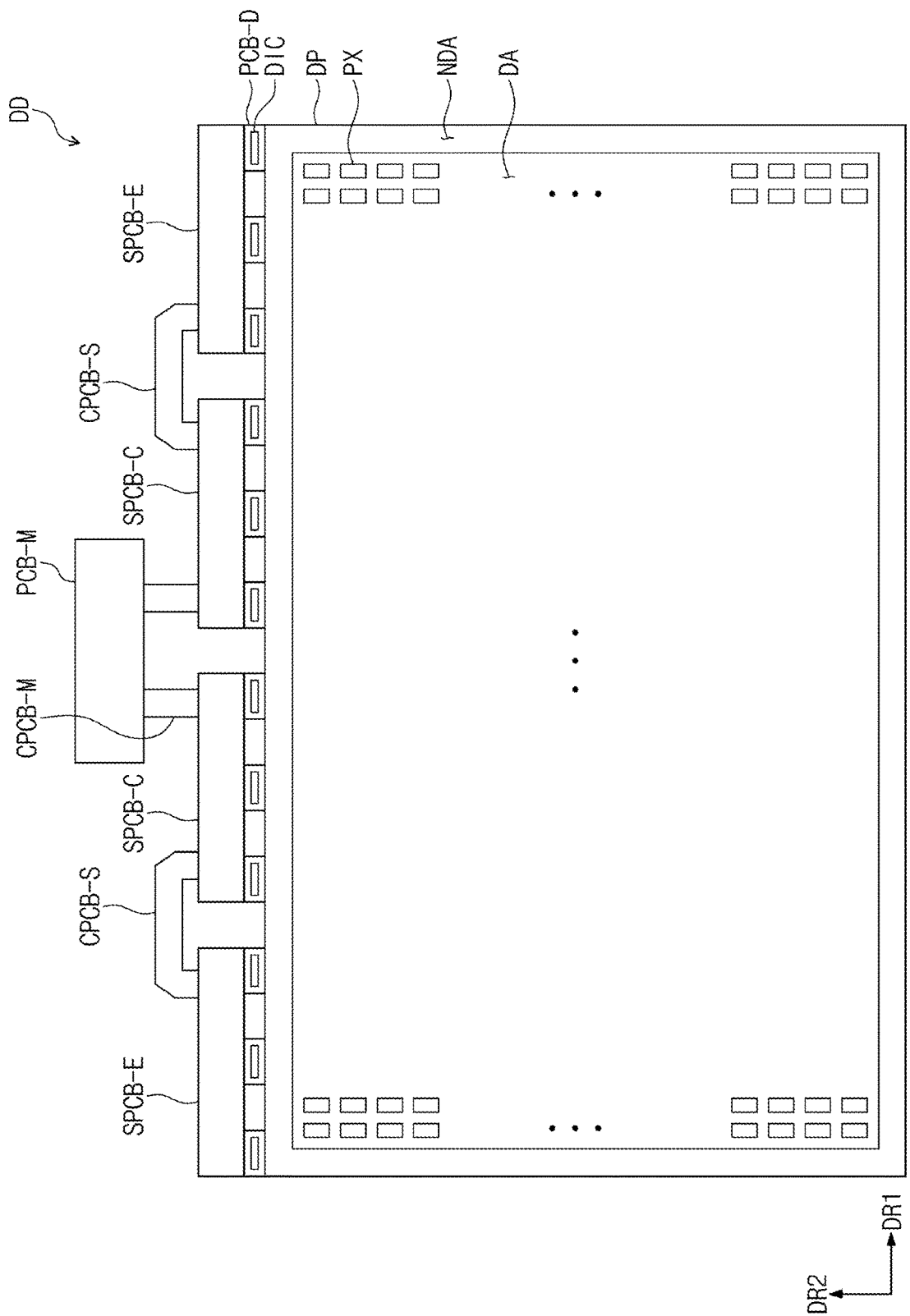
FIG. 1 is a diagram schematically illustrating a display device according to one exemplary embodiment of the present disclosure.

Herein below, preferred embodiments of the disclosure will be described in detail with reference to the accompanying drawings. Herein, when a component (region, layer, portion or the like) is described as being "present on," "connected to," "coupled to," or "combined with" another component (region, layer, portion, or the like), it should be understood that the component may be present on, connected to, coupled to, or combined with another component directly or with another component interposing therebetween.

Like components are denoted by like reference numerals. In the drawings, the thicknesses, aspect ratios, and dimensions of components may be exaggeratedly illustrated for clarity and convenience of description. Moreover, the term "and/or" includes any and all combinations of one or more of the associated listed items. Namely, it can mean either of the listed items alone or both of them.

Terms "first," "second," etc., can be used to discriminate one component from another component, but the order or priority of the elements are not limited by the terms unless specifically stated. These terms are used only for the purpose of distinguishing a component from another component. For example, a first component may be referred to as a second component, and the second component may be also referred to as the first component. As used herein, the singular forms "a," "an," and "the" are intended to include the plural forms as well unless the context clearly indicates otherwise.

The terms "below," "lower," "above," "upper" and the like are used to describe the relationship of the configurations shown in the drawings. The above terms are relative in concept and are described with reference to the directions indicated in the drawings.

The terms "comprises," "includes," or "has," when used in this specification, specify the presence of stated features, regions, integers, steps, operations, elements and/or components, but do not preclude the presence or addition of one or more other features, regions, integers, steps, operations, elements, components and/or combinations thereof.

Structure of Power Supply Circuit

Figure 2:
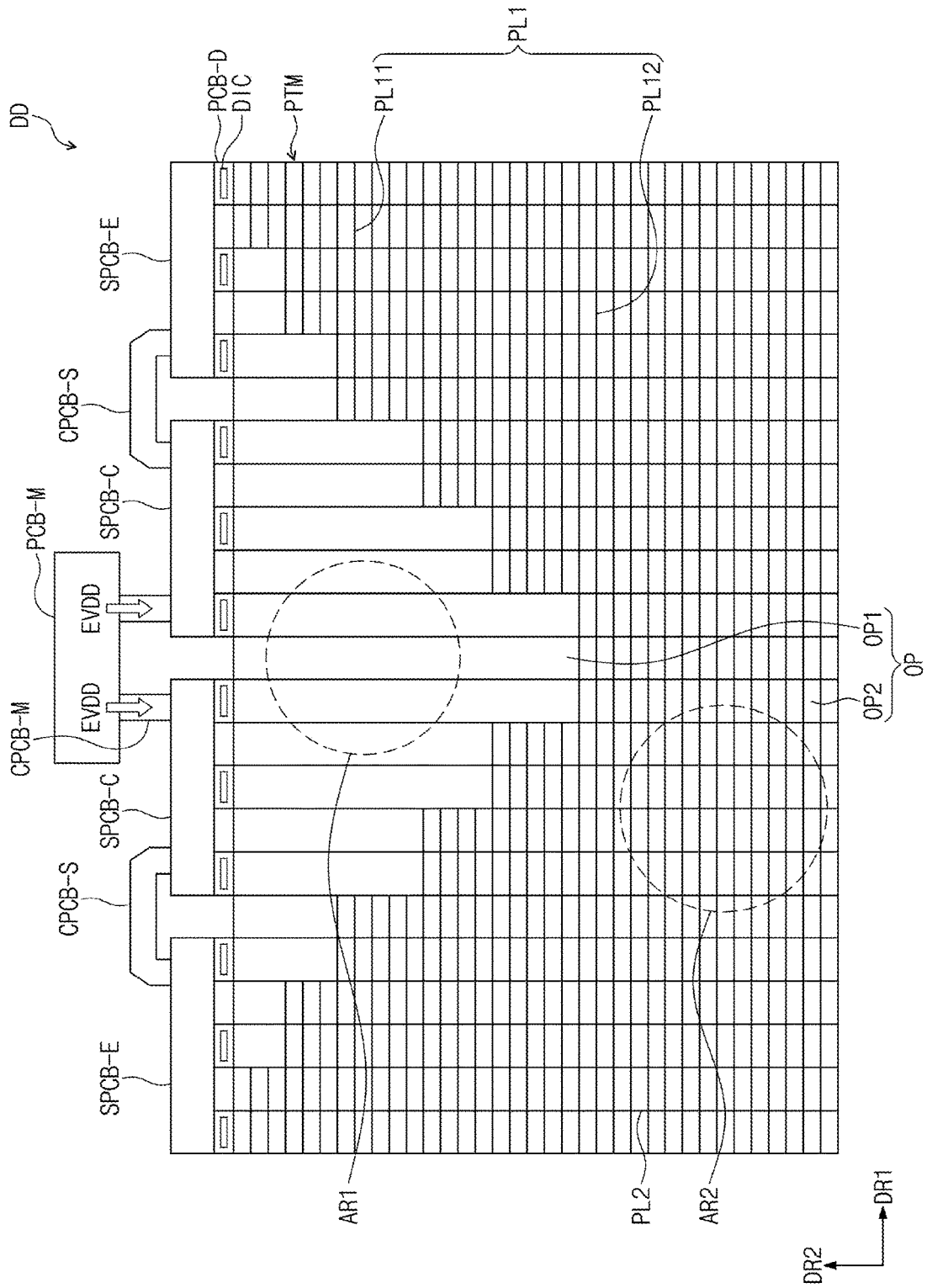
FIG. 2 is a diagram schematically illustrating a power supply circuit of a display panel of FIG. 1.

FIG. 1 is a diagram schematically illustrating a display device DD according to one exemplary embodiment. FIG. 2 is a diagram schematically illustrating a power supply circuit PTM of a display panel DP illustrated in FIG. 1.

In one embodiment, the display device DD includes a display panel DP, data circuit boards PCB-D, data driving circuits DIC, a main circuit board PCB-M, sub-circuit boards SPCB-C and SPCB-E, main connection circuit boards CPCB-M, and sub-connection circuit boards CPCB-S. The sub-circuit boards SPCB-C and SPCB-E are composed of center circuit boards SPCB-C and edge circuit boards SPCB-E.

The display panel DP has a display region DA and a non-display region NDA.

The display region DA is parallel to a plane defined with a first direction DR1 and a second direction DR2.

The shape of the display region DA illustrated in FIG. 2 is exemplary, and the shape of the display region DA may vary without any limitation.

The non-display region NDA is an area which is adjacent to the display region DA and within which no image is displayed. A bezel region of the display device DD can be defined by the non-display region NDA. The non-display region NDA surrounds the display region DA. However, but the shapes of the display region DA and the non-display region NDA are not limited thereto and are relatively determined.

The display panel DP includes a plurality of pixels PX and a power supply circuit PTM. The pixels PX are arranged within the display region DA of the display panel DP.

The power supply circuit PTM at least partially exists within the display region DA of the display panel DP.

The power supply circuit PTM transfers electric power to the pixels PX. The pixels PX emit light by receiving electric power from the power supply circuit PTM.

The power supply circuit PTM includes a plurality of first power lines PL1 and a plurality of second power lines PL2. The first power lines PL1 and the second power lines PL2 are electrically connected to each other.

Each of the first power lines PL1 extends in the first direction DR1. The first power lines PL1 are arranged in the second direction DR2.

Each of the second power lines PL2 extends in the second direction DR2. The second power lines PL2 are arranged in the first direction DR1.

In one embodiment, the power supply circuit PTM includes a first portion AR1 spaced apart from the main circuit board PCB-M by a first distance and a second portion AR2 spaced apart from the main circuit board PCB-M by a second distance that is longer than the first distance. The first portion AR1 of the power supply circuit PTM has a first density of the first power lines (PL1, PL1-1) and/or of the second power lines (PL2) and the second portion AR2 of the power supply circuit PTM has a second density of the first power lines (PL1, PL1-1) and/or of the second power lines (PL2) that is higher than the first density. In one embodiment, the area of each of the first portion AR1 and the second portion AR2 is 10% or more with respect to the total area of the power supply circuit PTM. In another embodiment, a reference position used to measure the first distance and the second distance may be one edge of the display panel DP rather than the main circuit board PCB-M.

In one embodiment, the first power lines PL1 include a first line PL11 and a second line PL12. The first line PL11 has a first length and is spaced apart from the main circuit board PCB-M by a third distance. The second line PL12 has a second length that is longer than the first length and is spaced apart from the main circuit board PCB-M by a fourth distance that is longer than the third distance. In another embodiment, a reference position used to measure the third distance and the fourth distance may be one edge of the display panel DP rather than the main circuit board PCB-M.

In one embodiment, the length of each of the first power lines PL1 gradually increases or decreases with the distance from the main circuit board PCB-M.

In one embodiment, a plurality of openings OP is defined within the area of the power supply circuit PTM. The openings OP include a first opening OP1 spaced apart from the main circuit board PCB-M by a fifth distance and a second opening OP2 spaced apart from the main circuit board PCB-M by a sixth distance. The first opening OP1 has a first size and the second opening OP2 has a second size smaller than the first size. In another embodiment, a reference position used to measure the fifth distance and the sixth distance may be one edge of the display panel DP rather than the main circuit board PCB-M.

In one embodiment, the size of each of the openings gradually increases or decreases with the distance from the main circuit board PCB-M.

The power supply circuit PTM receives a power supply voltage at a portion thereof which is adjacent to one side of the main circuit board PCB-M or the display panel DP. Therefore, since the power supply circuit PTM has the shape illustrated in FIG. 2, it is possible to prevent a phenomenon in which the temperature of the power supply circuit PTM locally varies due to the received power supply voltage. Accordingly, it is possible to prevent the pixels PX from being deteriorated by the heat generated in the power supply circuit PTM, resulting in a display device with an overall uniform display quality.

Several data circuit boards of the multiple data circuit boards PCB-D electrically connect the display panel DP with the center circuit boards SPCB-C, while others electrically connect the display panel DP with the edge circuit boards SPCB-E.

The data driving circuits DIC are mounted on the data circuit boards PCB-D, respectively. The data driving circuits DIC supply data signals to the pixels PX.

In one embodiment, the main circuit board PCB-M is a substrate on which components for receiving an electrical signal or electric power that is externally supplied and for transmitting the received electrical signal or electric power to the display panel DP are mounted. For example, the main circuit board PCB-M may be equipped with a signal control circuit (for example, timing controller) for controlling electrical signals to be supplied to the display panel DP.

The center circuit boards SPCB-C and the edge circuit boards SPCB-E are arranged in the first direction DR1. The center circuit boards SPCB-C are disposed between the edge circuit boards SPCB-E in the first direction DR1.

In one embodiment, the main connection circuit boards CPCB-M electrically connect the main circuit board PCB-M with the center circuit boards SPCB-C.

Each of the sub-connection circuit boards CPCB-S electrically connects the center circuit board SPCB-C and the edge circuit board SPCB-E disposed adjacent to each other.

Figure 3:
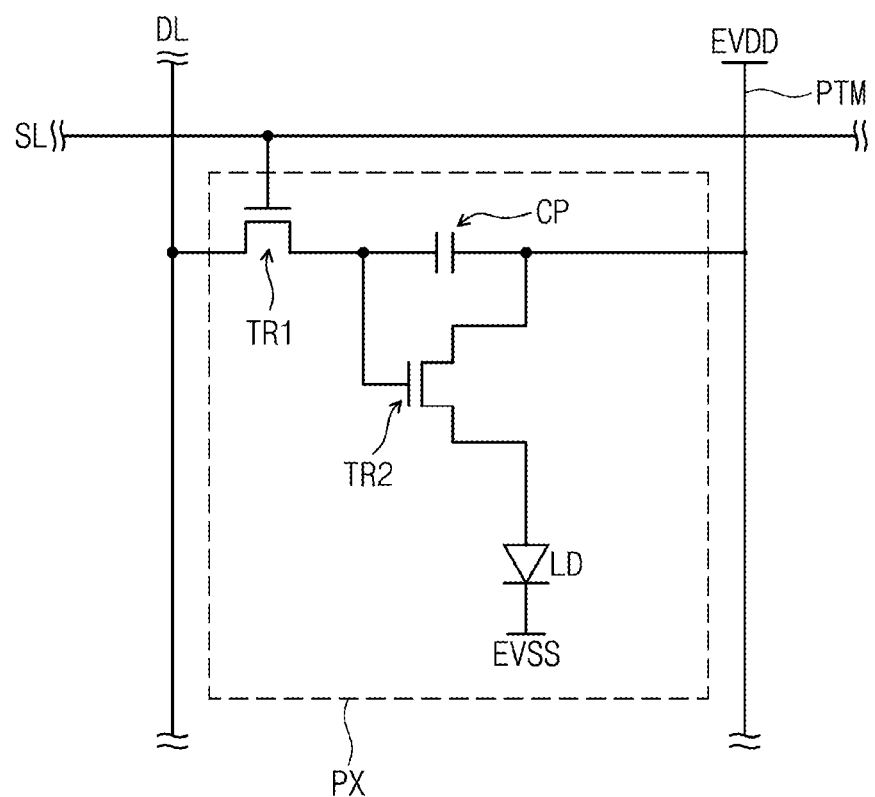
FIG. 3 is a circuitry diagram schematically illustrating an equivalent circuit of a pixel according to the embodiment.

FIG. 3 is a circuitry diagram schematically illustrating an equivalent circuit of a pixel according to one embodiment.

Each of the pixels PX is composed of first and second transistors TR1 and TR2, a capacitor CP, and a light-emitting element LD. Although the pixel in the present embodiment includes two transistors TR1 and TR2 and one capacitor CP, the configuration of the pixel PX is not limited thereto.

The anode electrode of the light-emitting element LD receives a first power supply voltage EVDD applied to the power supply circuit PTM through the second transistor TR2. Referring to FIG. 2, the power supply circuit PTM receives the first power supply voltage EVDD to be supplied to the light-emitting device LD through the main circuit board PCB-M, the main connection circuit board CPCB-M, and the data circuit board PCB-D. The cathode electrode of the light-emitting element LD receives a second power supply voltage EVSS. The first transistor TR1 transfers a data signal applied to a data line DL in response to a scan signal applied to a scan line SL. The capacitor CP charges a voltage corresponding to the data signal received from the first transistor TR1. The second transistor TR2 controls an electric current flowing through the light-emitting element LD according to the voltage stored in the capacitor CP.

Figure 4:
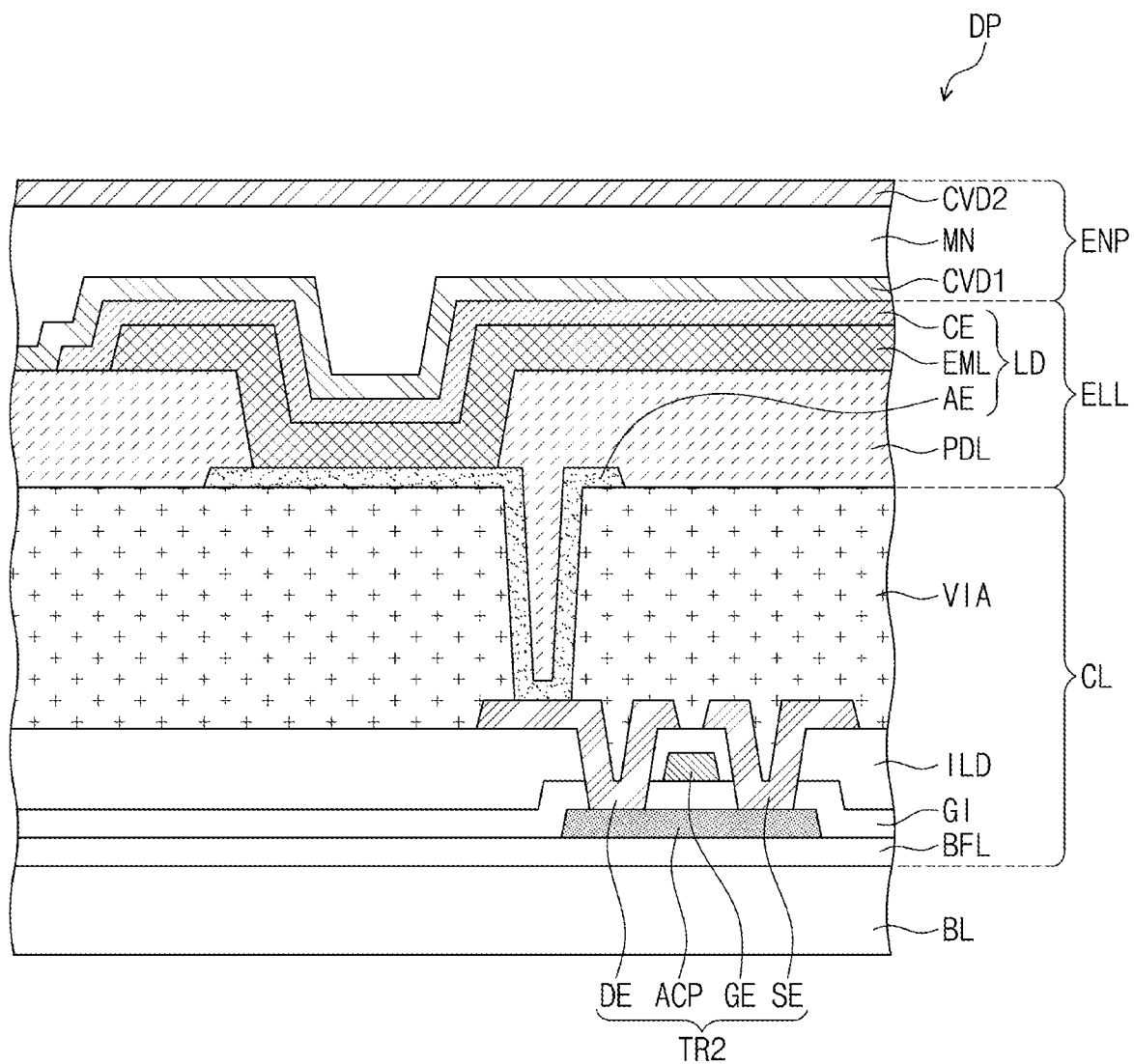
FIG. 4 is a view schematically illustrating a portion of a cross-section of the display panel according to the embodiment.

FIG. 4 is a diagram schematically illustrating a portion of a cross-section of a display panel PD according to one exemplary embodiment.

The display panel DP includes a base layer BL, a circuit layer CL, a light-emitting element layer ELL, and an encapsulation layer ENP.

The base layer BL may contain synthetic resin. Specifically, the base layer BL may contain polyimide (PI) but the synthetic resin is not limited thereto.

The circuit layer CL is disposed on the base layer BL. The circuit layer CL includes transistors TR1 and TR2 (see FIG. 3), a capacitor CP (see FIG. 3), a plurality of lines SL and DL (see FIG. 3) connected to the transistors TR1 and TR2 (see FIG. 3), a power supply circuit PTM (see FIGS. 2 and 3), a buffer layer BFL, a gate insulating layer GI, an interlayer insulating layer ILD, and a via layer VIA.

Each of the transistors TR1 and TR2 (see FIG. 3) includes an activation pattern ACP, a control electrode GE, an input electrode SE, and an output electrode DE.

The activation pattern ACP may contain, but not limited to, polysilicon, amorphous silicon, or metal oxide semiconductor.

The buffer layer BFL is disposed on the base layer BL. The buffer layer BFL prevents impurities present in the base layer BL from entering the pixel PX. Particularly, the buffer layer BFL prevents impurities from diffusing into the activation pattern ACP of a corresponding one of the transistors TR1 and TR2 constituting the pixel PX.

The impurities may be externally introduced or internally generated by the thermal decomposition of the base layer BL. The impurity may be gas or sodium expelled from the base layer BL. In addition, the buffer layer BFL blocks moisture from entering the pixel PX.

The gate insulating layer GI is disposed on the buffer layer BFL and covers the activation pattern ACP.

The interlayer insulating layer ILD is disposed on the gate insulating layer GI and covers a control electrode GE.

The via layer VIA is disposed on the interlayer insulating layer ILD and covers an input electrode SE and an output electrode DE.

In one embodiment, each of the gate insulating layer GI and the interlayer insulating layer ILD contain silicon nitride or silicon oxide.

In one embodiment, the via layer VIA contains an organic material and/or an inorganic material.

The light-emitting element layer ELL includes a light-emitting element LD and a pixel-defining film PDL. The light-emitting element LD includes an anode electrode AE, a light-emitting layer EML, and a cathode electrode CE.

The anode electrode AE is disposed on the via layer VIA. The anode electrode AE is electrically connected to the output electrode DE through a contact hole.

The pixel-defining film PDL is disposed on the via layer VIA and is patterned to expose at least a portion of the anode electrode AE. The pixel-defining film contains an organic material and/or an inorganic material.

The light-emitting layer EML is disposed on the anode electrode AE.

When the light-emitting element LD is an organic light-emitting diode (OLED), the light-emitting layer EML contains an organic material. In another embodiment, when the light-emitting element LD is a micro LED, the light-emitting layer EML contains an inorganic material.

The cathode electrode CE is disposed on the light-emitting layer EML.

The encapsulation layer ENP includes a first inorganic layer CVD1, an organic layer MN, and a second inorganic layer CVD2. Although FIG. 4 illustrates the encapsulation layer ENP composed of two inorganic layers and one organic layer, the configuration of the encapsulation layer ENP is not limited thereto. For example, the encapsulation layer ENP may be composed of three inorganic layers and two organic layers. In this case, the encapsulation layer ENP is structured such that the inorganic layers and the organic layers are alternately stacked.

Figure 5:
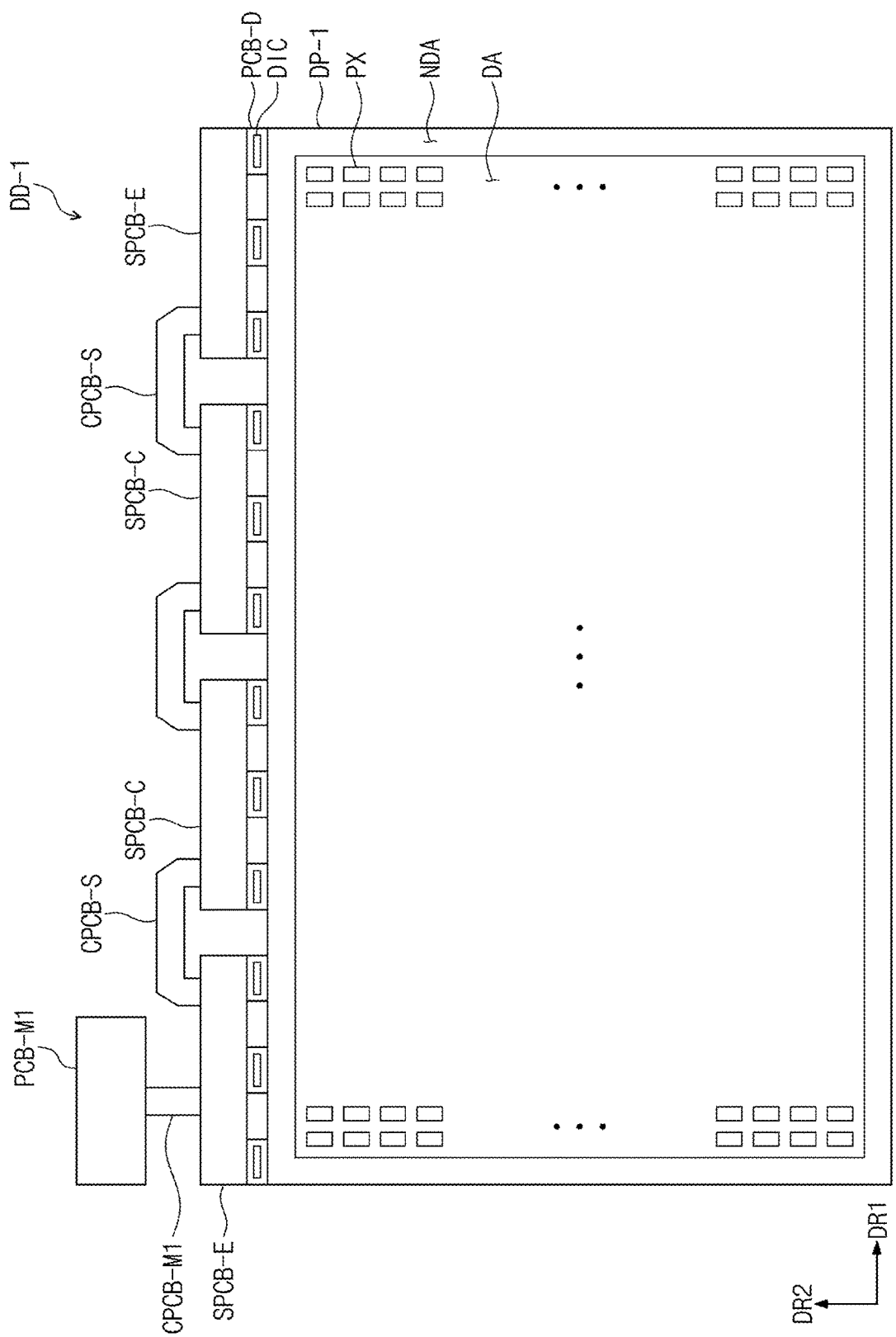
FIG. 5 is a view schematically illustrating a display device according to another exemplary embodiment of the present disclosure.
Figure 6:
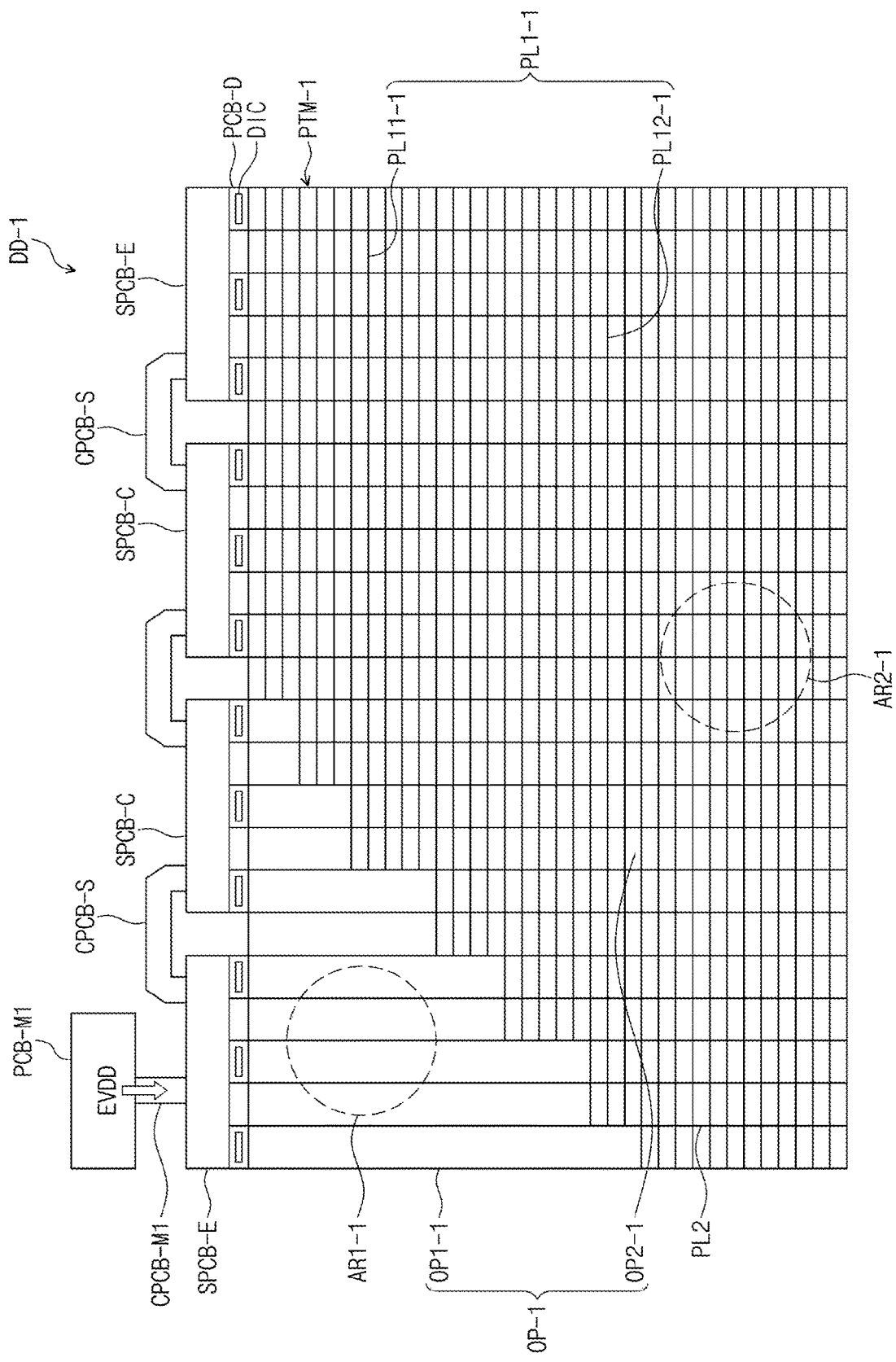
FIG. 6 is a diagram schematically illustrating a power supply circuit of a display panel of FIG. 5.

FIG. 5 schematically illustrates a display device DD-1 according to one exemplary embodiment. FIG. 6 schematically illustrates a power supply circuit PTM-1 of a display panel DP-1 illustrated in FIG. 5.

In this embodiment, the display device DD-1 includes a display panel DP-1, multiple data circuit boards PCB-D, multiple data driving circuits DIC, a main circuit board PCB-M1, multiple sub-circuit boards SPCB-C and SPCB-E, a main connection circuit board CPCB-M1, and multiple sub-connection circuit boards CPCB-S.

The display panel DP-1 includes a plurality of pixels PX and the power supply circuit PTM-1.

The display device DD-1 illustrated in FIG. 5 differs from the display divide DD illustrated in FIG. 1 in a point that the main connection circuit board CPCB-M1 electrically connects the main circuit board PCB-M1 and the edge circuit board SPCB-E to each other. Accordingly, the power supply circuit PTM-1 illustrated in FIG. 6 is partially different in shape from the power supply circuit PTM illustrated in FIG. 2.

The display panel DP-1 includes the plurality of pixels PX and the power supply circuit PTM-1.

The power supply circuit PTM-1 includes a plurality of first power lines PL1-1 and a plurality of second power lines PL2. The first power lines PL1-1 and the second power lines PL2 are electrically connected to each other.

Each of the first power lines PL1-1 extends in the first direction DR1. The first power lines PL1-1 are arranged in the second direction DR2.

Each of the second power lines PL2 extends in the second direction DR2. The second power lines PL2 are arranged in the first direction DR1.

A plurality of openings OP-1 is defined between the first power lines PL1-1 and the second power lines PL2.

In one embodiment, the power supply circuit PTM-1 includes a first portion AR1-1 spaced apart from the main circuit board PCB-M by a first distance and a second portion AR2-1 spaced apart from the main circuit board PCB-M by a second distance that is longer than the first distance. The first portion AR1-1 of the power supply circuit PTM-1 has a first density of the first power lines (PL1, PL1-1) and/or of the second power lines (PL2) and the second portion AR2-1 of the power supply circuit PTM-1 has a second density of the first power lines (PL1, PL1-1) and/or of the second power lines (PL2) that is higher than the first density. In one embodiment, the area of each of the first portion AR1-1 and the second portion AR2-1 is 10% or more with respect to the total area of the power supply circuit PTM-1. In another embodiment, a reference position used to measure the first distance and the second distance may be one edge of the display panel DP-1 rather than the main circuit board PCB-M1.

In one embodiment, the first power lines PL1-1 include a first line PL11-1 and a second line PL12-1. The first line PL11-1 has a first length and is spaced apart from the main circuit board PCB-M by a third distance. The second line PL12-1 has a second length that is longer than the first length and is spaced apart from the main circuit board PCB-M by a fourth distance that is longer than the third distance. In another embodiment, a reference position used to measure the third distance and the fourth distance may be one edge of the display panel DP-1 rather than the main circuit board PCB-M1.

In one embodiment, the length of each of the first power lines PL1-1 gradually increases or decreases with the distance from the main circuit board PCB-M1.

In one embodiment, a plurality of openings OP-1 is defined within the area of the power supply circuit PTM. The openings OP-1 include a first opening OP1-1 spaced apart from the main circuit board PCB-M1 by a fifth distance and a second opening OP2-1 spaced apart from the main circuit board PCB-M1 by a sixth distance. The first opening OP1-1 has a first size and the second opening OP2-1 has a second size smaller than the first size. In another embodiment, a reference position used to measure the fifth distance and the sixth distance may be one edge of the display panel DP-1 rather than the main circuit board PCB-M1.

In one embodiment, the size of each of the openings OP-1 gradually increases or decreases with the distance from the main circuit board PCB-M1.

Figure 7:
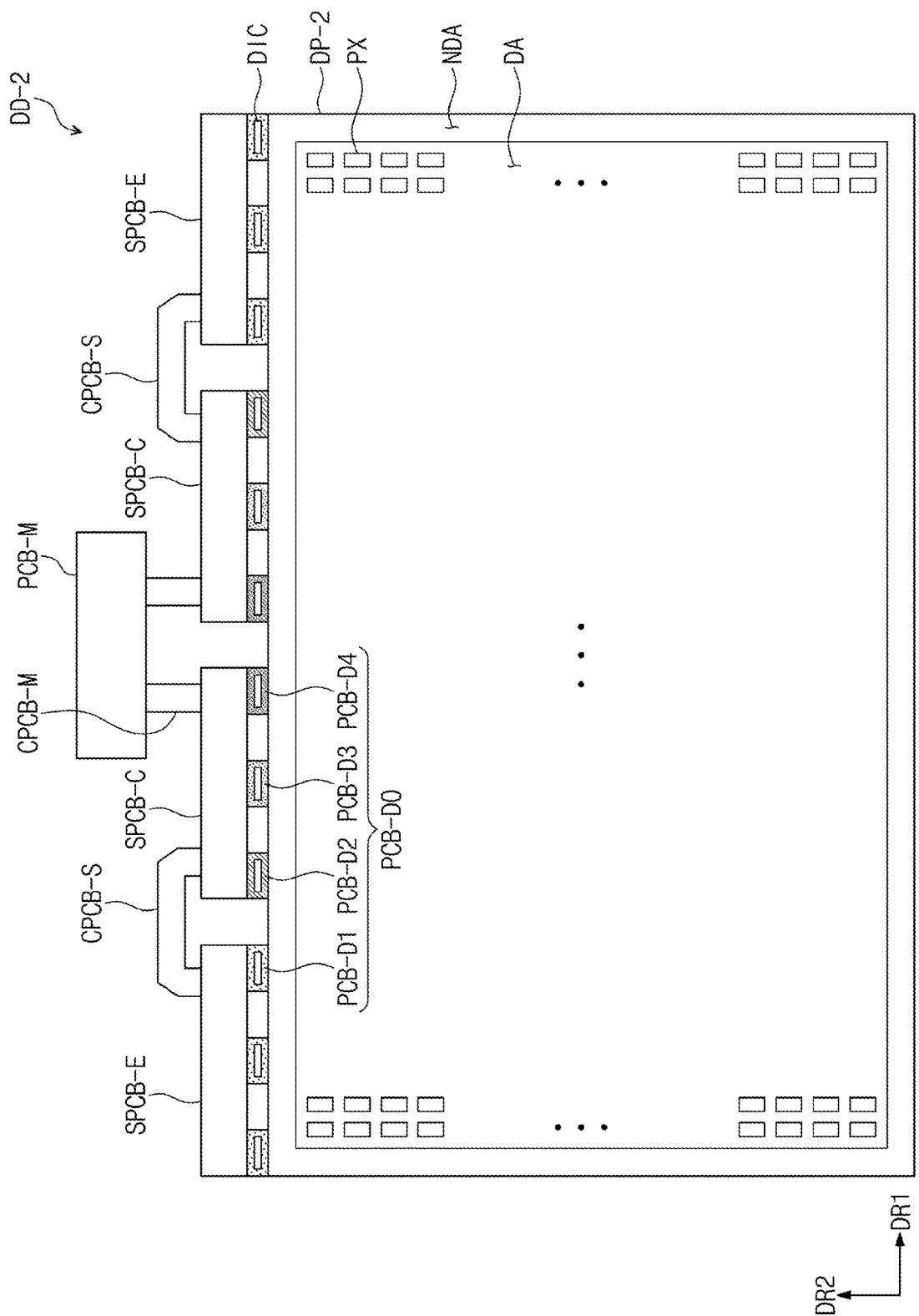
FIG. 7 is a diagram schematically illustrating a display device according to a further exemplary embodiment of the present disclosure.
Figure 8:
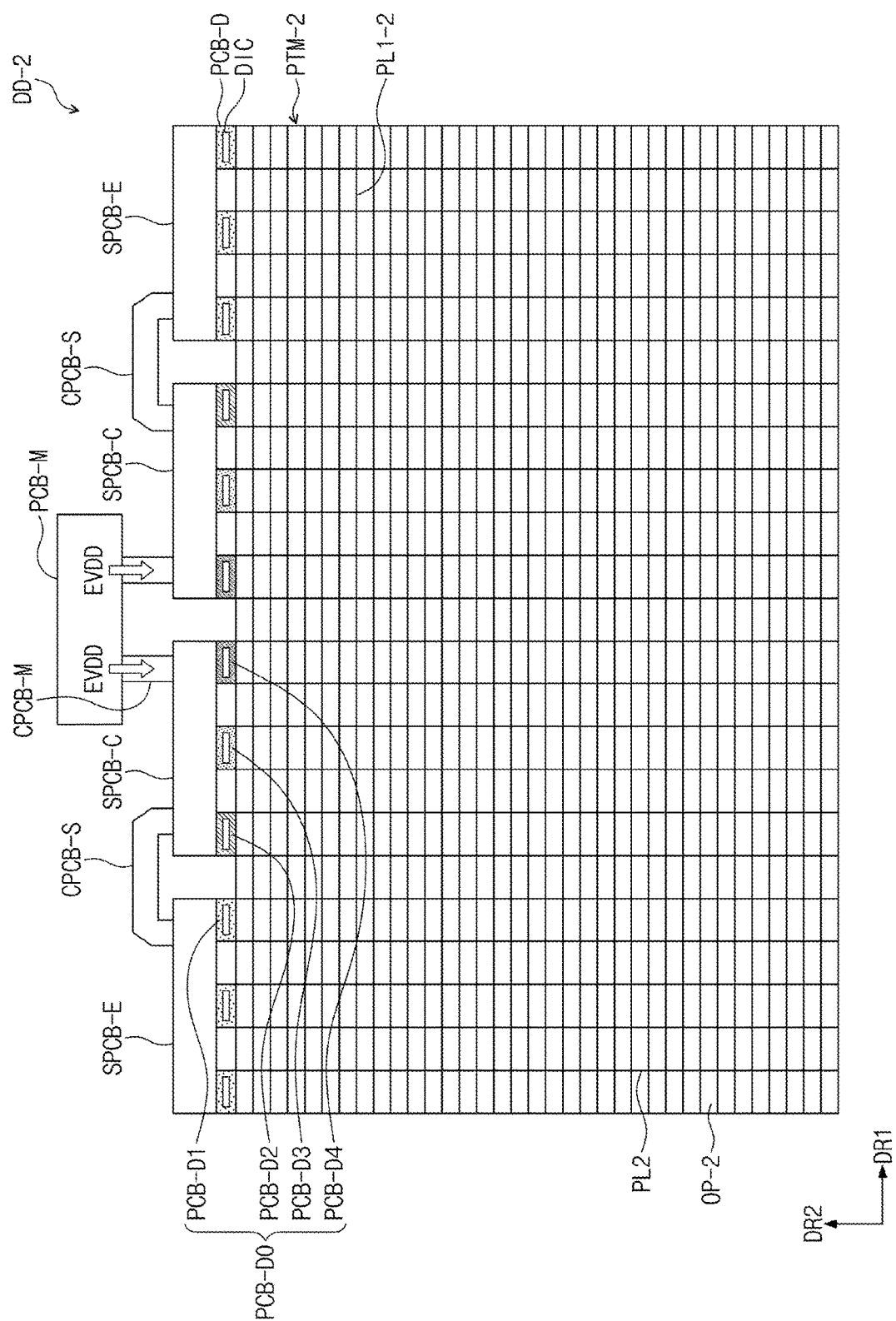
FIG. 8 is a diagram schematically illustrating a power supply circuit of a display panel of FIG. 7.

FIG. 7 schematically illustrates a display device DD-2 according to one exemplary embodiment. FIG. 8 schematically illustrates a power supply circuit PTM-2 of a display panel DP-2 illustrated in FIG. 7.

In one embodiment, the display device DD-2 includes a display panel DP-2, multiple data circuit boards PCB-DO, multiple data driving circuits DIC, a main circuit board PCB-M, multiple sub-circuit boards SPCB-C and SPCB-E, multiple main connection circuit boards CPCB-M, and multiple sub-connection circuit boards CPCB-S. The sub-circuit boards SPCB-C and SPCB-E include center circuit boards SPCB-C and edge circuit boards SPCB-E.

The data circuit boards PCB-DO include a first data circuit board PCB-D1, a second data circuit board PCB-D2, a third data circuit board PCB-D3, and a fourth data circuit board PCB-D4.

The distance between the first data circuit board PCB-D1 and the main circuit board PCB-M is longer than the distance between the second data circuit board PCB-D2 and the main circuit board PCB-M. The distance between the second data circuit board PCB-D2 and the main circuit board PCB-M is longer than the distance between the third data circuit board PCB-D3 and the main circuit board PCB-M. The distance between the third data circuit board PCB-D3 and the main circuit board PCB-M is longer than the distance between the fourth data circuit board PCB-D4 and the main circuit board PCB-M.

The power supply circuit PTM-2 illustrated in FIG. 8 has a different structure than the power supply circuit PTM illustrated in FIG. 2 and the power supply circuit PTM-1 illustrated in FIG. 6.

The power supply circuit PTM-2 includes a plurality of first power lines PL1-2 and a plurality of second power lines PL2. The first power lines PL1-2 and the second power lines PL2 are electrically connected to each other.

Each of the first power lines PL1-2 extends in the first direction DR1. The first power lines PL1-2 are arranged in the second direction DR2.

Each of the second power lines PL2 extends in the second direction DR2. The second power lines PL2 are arranged in the first direction DR1.

A plurality of openings OP-2 is defined within the area of the power supply circuit PTM-2.

Each of the openings OP-2 in the power supply circuit PTM-2 has substantially the same size.

Figure 9:
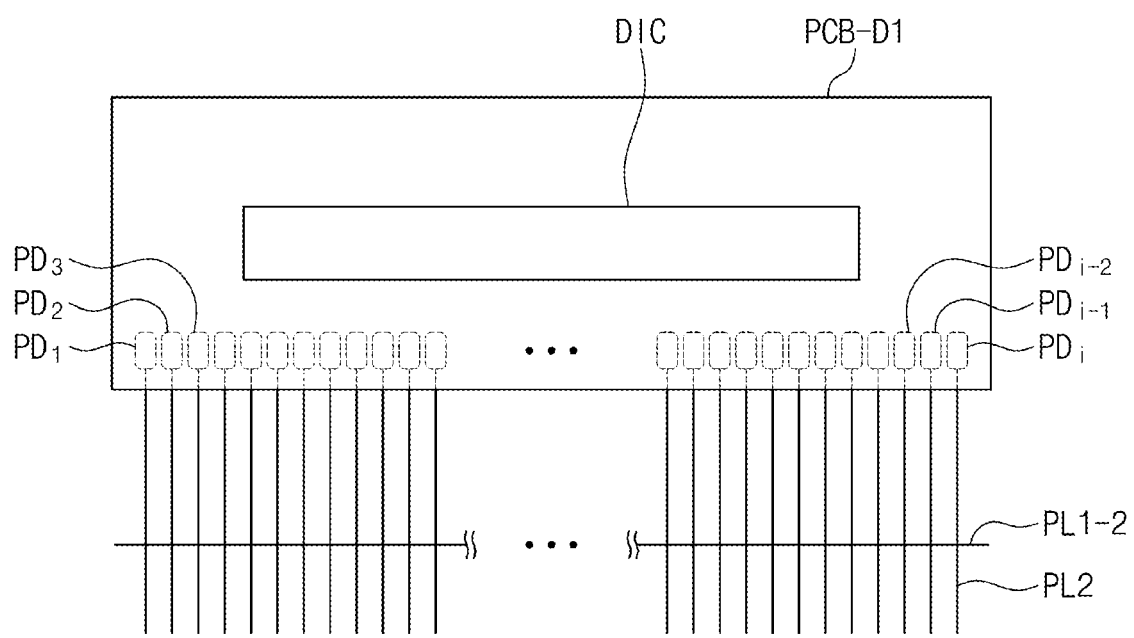
FIG. 9 is a diagram schematically illustrating a connection between a first data circuit board and the power supply circuit of FIG. 8.
Figure 10:
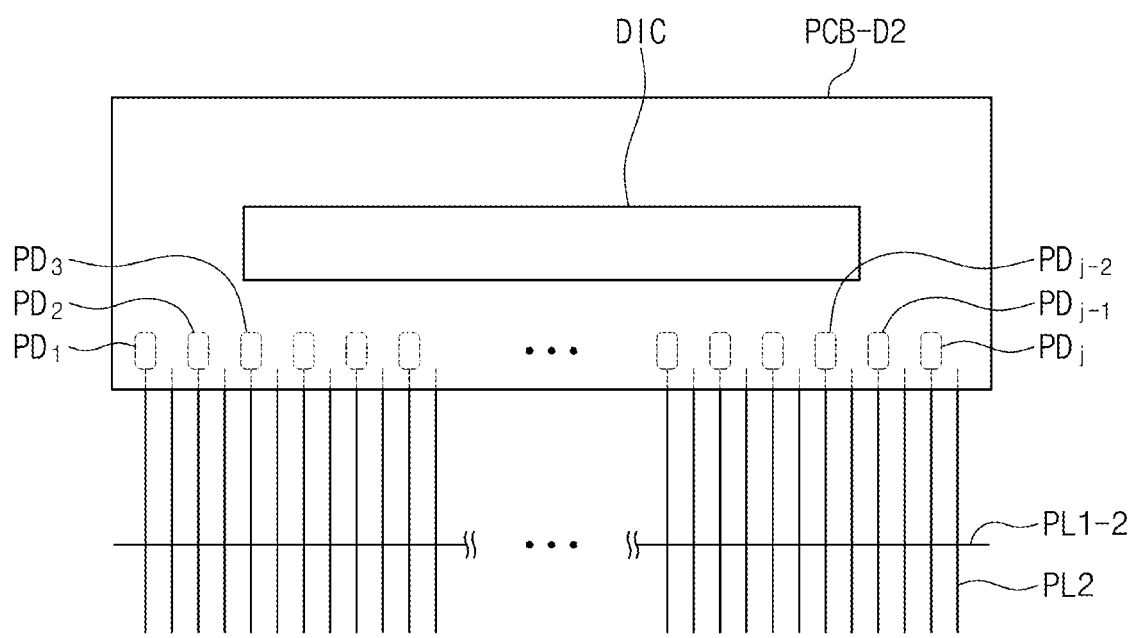
FIG. 10 is a diagram schematically illustrating a connection between a second data circuit board and the power supply circuit of FIG. 8.
Figure 11:
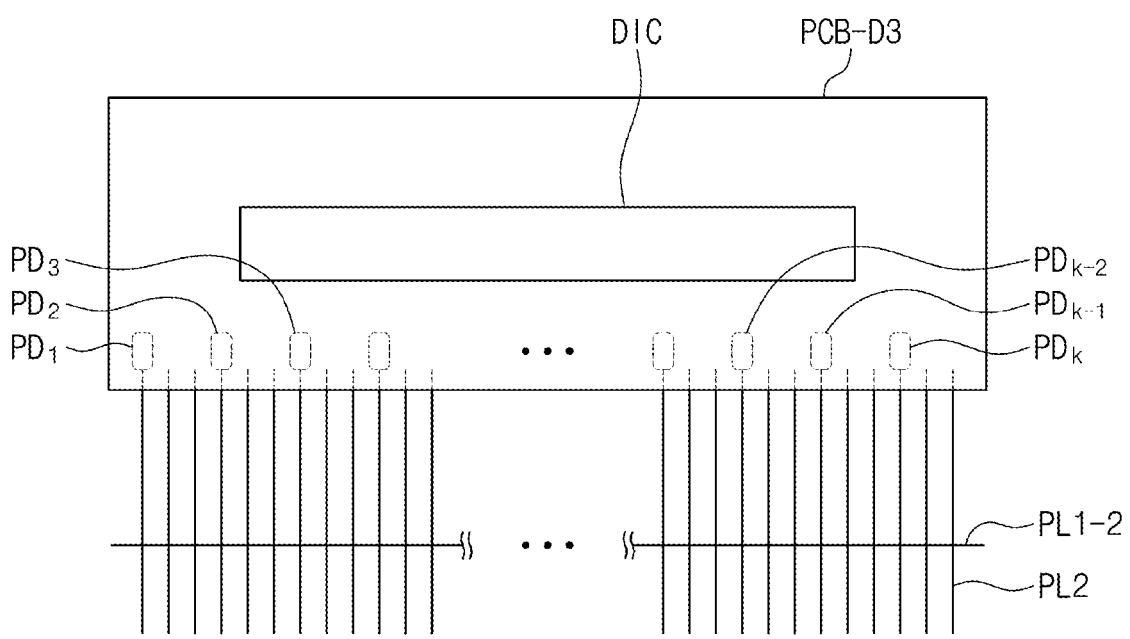
FIG. 11 is a diagram schematically illustrating n illustration of a connection between a third data circuit board and the power supply circuit of FIG. 8.
Figure 12:
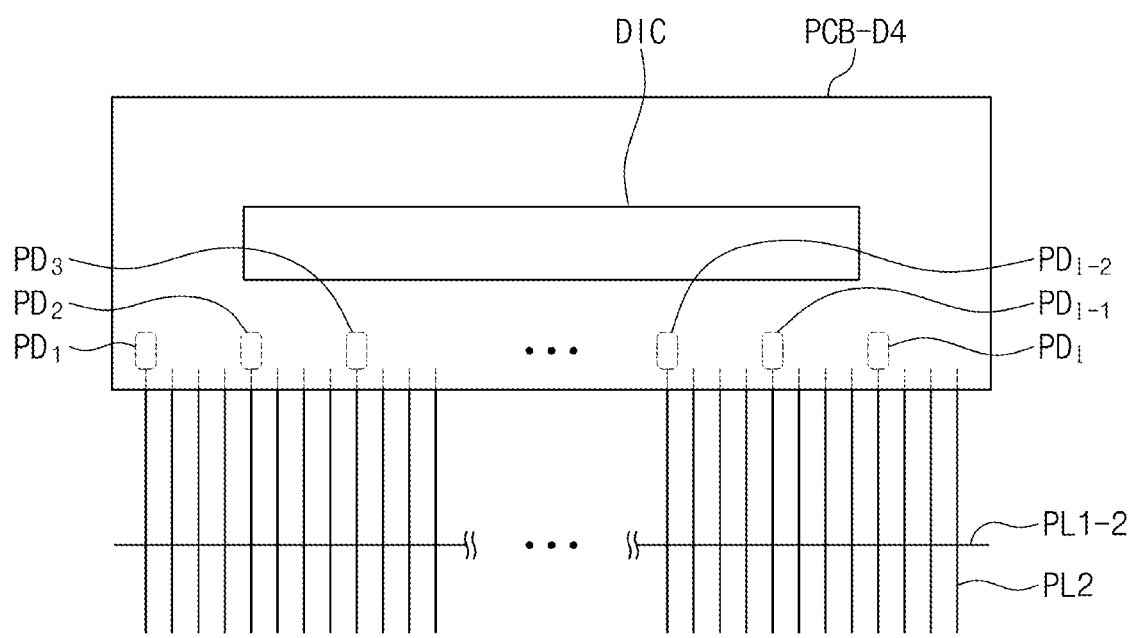
FIG. 12 is a diagram schematically illustrating a connection between a fourth data circuit board and the power supply circuit of FIG. 8.

FIG. 9 schematically illustrates a connection between the first data circuit board and the power supply circuit illustrated in FIG. 8. FIG. 10 schematically illustrates a connection between the second data circuit board PCB-D2 and the power supply circuit PTM-2. FIG. 11 schematically illustrates a connection between the third data circuit board PCB-D3 and the power supply circuit PTM-2. FIG. 12 schematically illustrates a connection between the fourth data circuit board PCB-D4 and the power supply circuit PTM-2.

Referring to FIG. 9, the first data circuit board PCB-D1 includes multiple (for example, i which is an integer number) pads PD1 to PDi. The display panel DP-2 includes multiple (for example, i which is an integer number) pads (not illustrated) electrically connected to the multiple pads PD1 to PDi.

The multiple pads PD1 to PDi are pads used to transfer a first power voltage EVDD supplied by the main circuit board PCB-M to the power supply circuit PTM-2.

Although FIG. 9 illustrates a configuration in which the multiple pads PD1 to PDi of the first data circuit board PCB-D1 are connected to the second power lines PL2 in a one-to-one correspondence manner, the present disclosure is not limited thereto.

Referring to FIG. 10, the second data circuit board PCB-D2 includes multiple (for example, j which is an integer number) pads PD1 to PDj. The display panel DP-2 includes multiple (for example, j which is an integer number) pads (not illustrated) electrically connected to the multiple pads PD1 to PDj of the second data circuit board PCB-D2.

The multiple pads PD1 to PDj are pads used to transfer the first power voltage EVDD supplied by the main circuit board PCB-M to the power supply circuit PTM-2.

Although FIG. 10 illustrates a configuration in which the multiple pads PD1 to PDj of the second data circuit board PCB-D2 are connected to the second power lines PL2 in a one-to-two correspondence manner, the present disclosure is not limited thereto.

Referring to FIG. 11, the third data circuit board PCB-D3 includes multiple (for example, k which is an integer number) pads PD1 to PDk. The display panel DP-2 includes multiple (for example, k) pads (not illustrated) electrically connected to the multiple pads PD1 to PDk of the third data circuit board PCB-D3.

The multiple pads PD1 to PDk of the third data circuit board PCB-D3 are pads used to transfer the first power voltage EVDD supplied by the main circuit board PCB-M to the power supply circuit PTM-2.

Although FIG. 11 illustrates a configuration in which the multiple pads PD1 to PDk of the third data circuit board PCB-D3 are connected to the second power lines PL2 in a one-to-three correspondence manner, the present disclosure is not limited thereto.

Referring to FIG. 12, the fourth data circuit board PCB-D4 includes multiple (for example, l which is an integer number) pads PD1 to PDl. The display panel DP-2 includes multiple (for example, 1) pads (not illustrated) electrically connected to the multiple pads PD1 to PD1 of the fourth data circuit board PCB-D4.

The multiple pads PD1 to PD1 of the fourth data circuit board PCB-D4 are pads used to transfer the first power voltage EVDD supplied by the main circuit board PCB-M to the power supply circuit PTM-2.

Although FIG. 12 illustrates a configuration in which the multiple pads PD1 to PD1 of the fourth data circuit board PCB-D4 are connected to the second power lines PL2 in a one-to-four correspondence manner, the present disclosure is not limited thereto.

Referring to FIGS. 9 to 12, the value of i is greater than the value of j, the value of j is greater than the value of k, and the value of k is greater than the value of l. For example, i is 12n (n is a natural number of 1 or more), j is 6n (n is a natural number of 1 or more, k is 4n (n is a natural number of 1 or more), and l is 3n (n is a natural number of 1 or more).

As described above, a function of transferring the first power voltage EVDD to the power supply circuit PTM-2 is performed by the main circuit board PCB-M. Therefore, the number of pads formed in each of the multiple data circuit boards PCB-D1 to PCB-D4 increases as the distance between the corresponding data circuit board and the main circuit board PCB-M increases. That is, the number of pads formed in each of the multiple data circuit boards PCB-D1 to PCB-D4 decreases as the distance between the corresponding data circuit board and the main circuit board PCB-M decreases. With this configuration, it is possible to prevent the power supply circuit PTM-2 from being locally unevenly heated.

Figure 13:
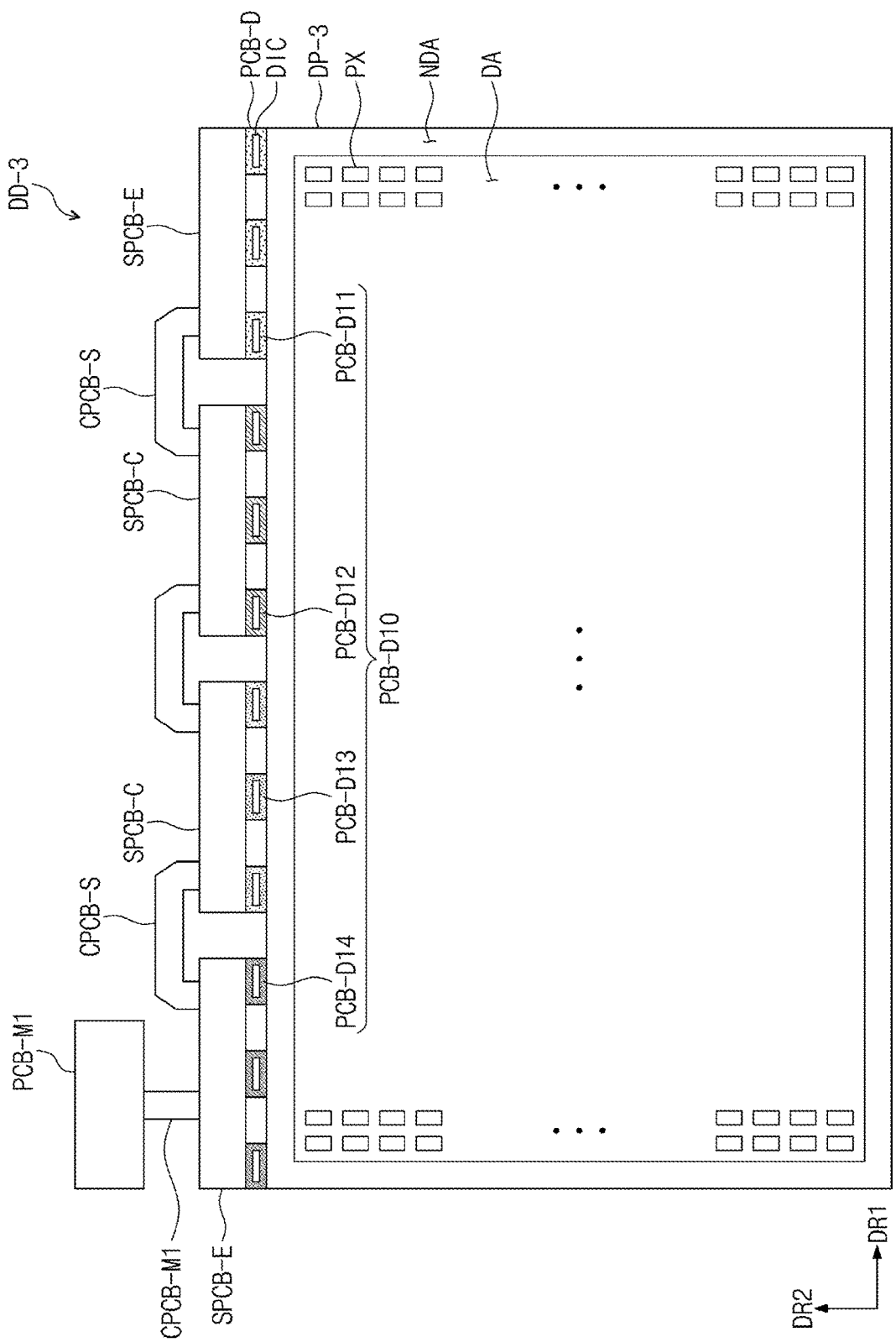
FIG. 13 is a diagram schematically illustrating a display device according to a yet further exemplary embodiment of the present disclosure.
Figure 14:
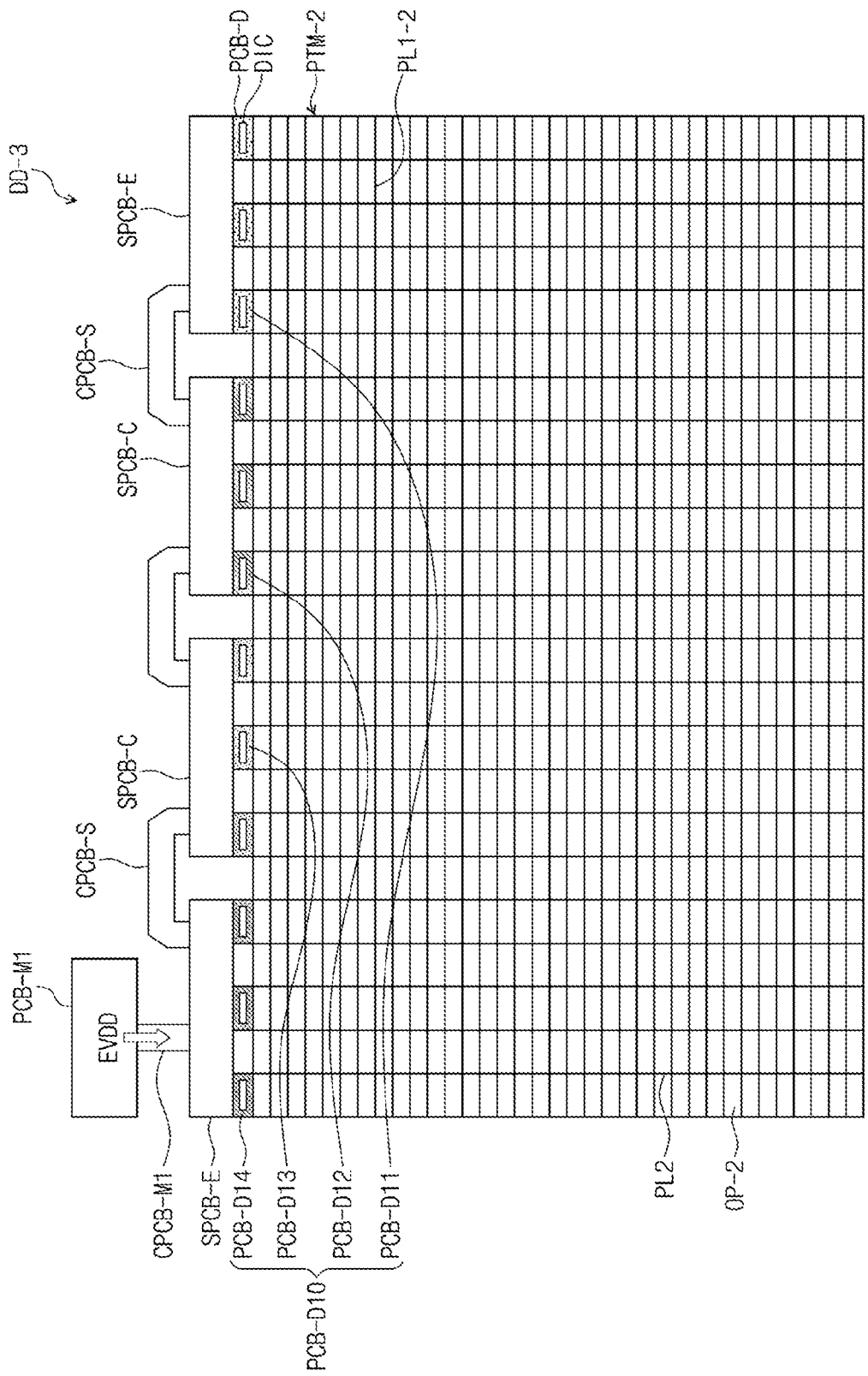
FIG. 14 is a diagram schematically illustrating a power supply circuit of a display panel of FIG. 13.

FIG. 13 schematically illustrates a display device DD-3 according to one exemplary embodiment. FIG. 14 schematically illustrates a power supply circuit PTM-2 of a display panel DP-3 illustrated in FIG. 13.

In one embodiment, the display device DD-3 includes a display panel DP-3, multiple data circuit boards PCB-D10, multiple data driving circuits DIC, a main circuit board PCB-M, multiple sub-circuit boards SPCB-C and SPCB-E, multiple main connection circuit boards CPCB-M, and multiple sub-connection circuit boards CPCB-S. The sub-circuit boards SPCB-C and SPCB-E include center circuit boards SPCB-C and edge circuit boards SPCB-E.

The data circuit boards PCB-D10 include a first data circuit board PCB-D11, a second data circuit board PCB-D12, a third data circuit board PCB-D13, and a fourth data circuit board PCB-D14.

The distance between the first data circuit board PCB-D11 and the main circuit board PCB-M is longer than the distance between the second data circuit board PCB-D12 and the main circuit board PCB-M. The distance between the second data circuit board PCB-D12 and the main circuit board PCB-M is longer than the distance between the third data circuit board PCB-D13 and the main circuit board PCB-M. The distance between the third data circuit board PCB-D13 and the main circuit board PCB-M is longer than the distance between the fourth data circuit board PCB-D14 and the main circuit board PCB-M.

Figure 15:
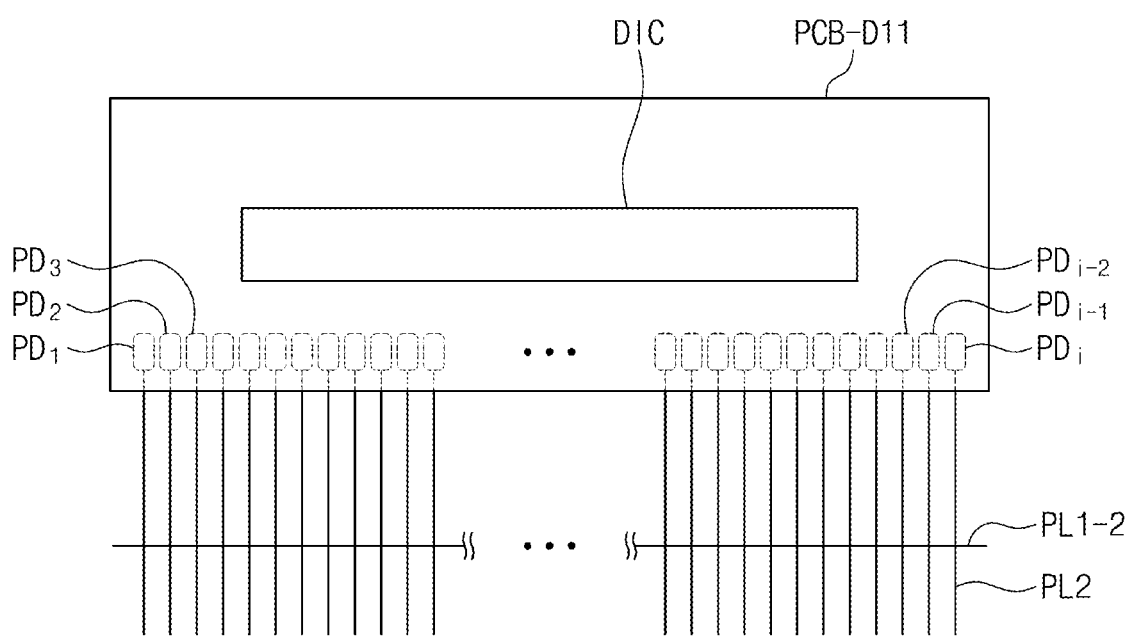
FIG. 15 is a diagram schematically illustrating a connection between a first data circuit board and the power supply circuit of FIG. 14.
Figure 16:
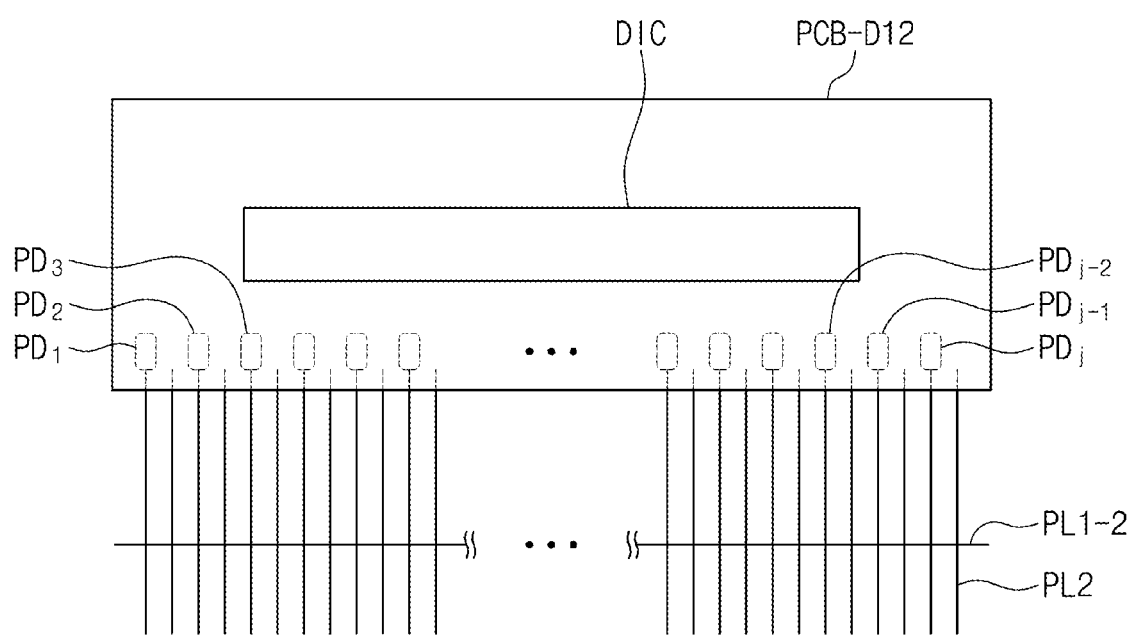
FIG. 16 is a diagram schematically illustrating a connection between a second data circuit board and the power supply circuit of FIG. 14.
Figure 17:
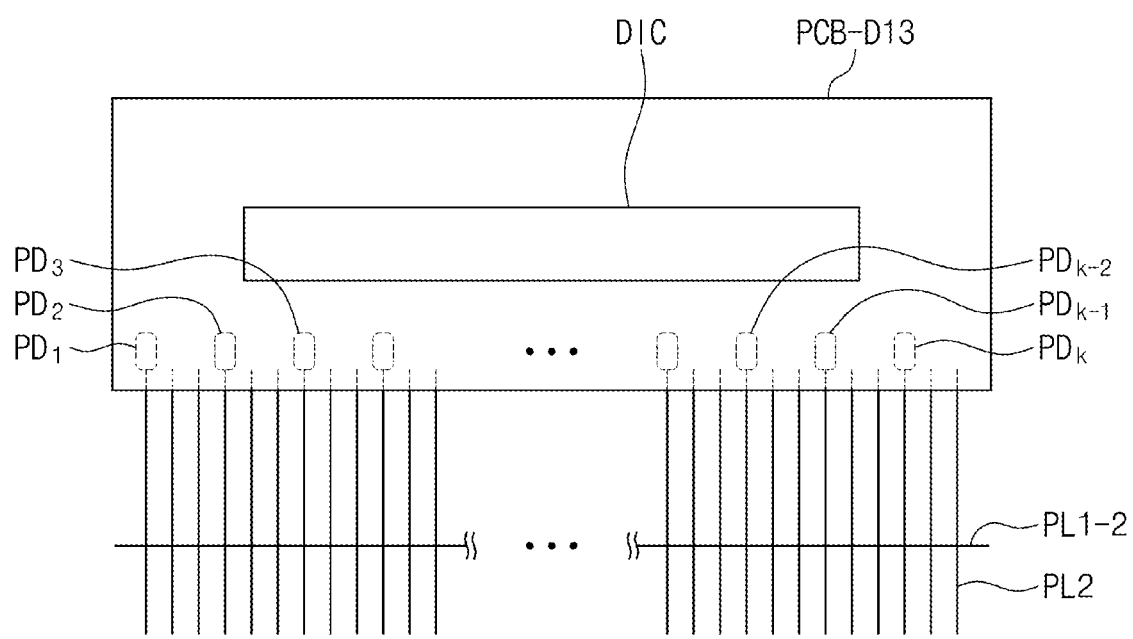
FIG. 17 is a diagram schematically illustrating n illustration of a connection between a third data circuit board and the power supply circuit of FIG. 14.
Figure 18:
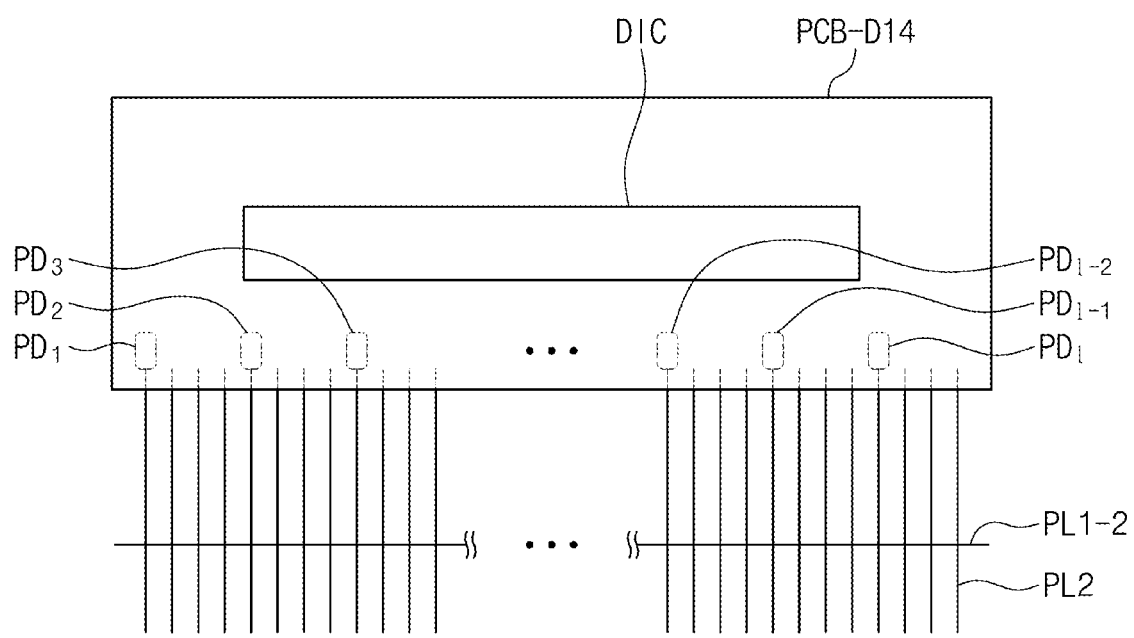
FIG. 18 is a diagram schematically illustrating a connection between a fourth data circuit board and the power supply circuit of FIG. 14.

FIG. 15 schematically illustrates a connection between the first data circuit board PCB-D11 illustrated in FIG. 14 and the power supply circuit. FIG. 16 schematically illustrates a connection between the second data circuit board PCB-D12 illustrated in FIG. 14 and the power supply circuit PTM-2. FIG. 17 schematically illustrates a connection between the third data circuit board PCB-D13 and the power supply circuit PTM-2. FIG. 18 schematically illustrates a connection between the fourth data circuit board PCB-D14 illustrated in FIG. 14 and the power supply circuit PTM-2.

The description of the first data circuit board PCB-D11 illustrated in FIG. 15 is substantially the same as the description of the first data circuit board PCB-D1 illustrated in FIG. 9. Therefore, the description of the first data circuit board PCB-D11 will not be redundantly provided herein.

The description of the second data circuit board PCB-D12 illustrated in FIG. 16 is substantially the same as the description of the second data circuit board PCB-D2 illustrated in FIG. 10. Therefore, the description of the second data circuit board PCB-D12 will not be redundantly provided herein.

The third data circuit board PCB-D13 illustrated in FIG. 17 is substantially the same as the third data circuit board PCB-D3 illustrated in FIG. 11. Therefore, the description of the third data circuit board PCB-D13 will not be redundantly provided herein.

The description of the fourth data circuit board PCB-D14 illustrated in FIG. 18 is substantially the same as the description of the fourth data circuit board PCB-D4 illustrated in FIG. 12. Therefore, the description of the fourth data circuit board PCB-D14 will not be redundantly provided herein.

With the configuration described above, the display device according to the first embodiment does not locally overheat, thereby preventing the light-emitting elements in the display panel from being deteriorated. In addition, the display device according to the first embodiment has an advantage of maintaining uniform display quality over the entire region of the display panel by preventing the display panel from locally overheating.

Control of Power Supply Path

Figure 19:
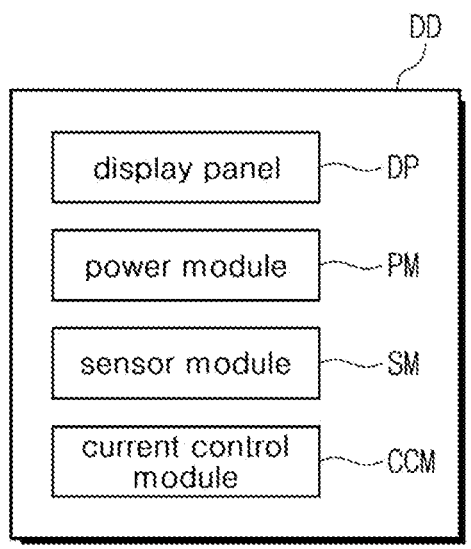
FIG. 19 is a block diagram of a display device according to one exemplary embodiment.

FIG. 19 is a block diagram of a display device DD according to one exemplary embodiment.

The display device DD includes a display panel DP, a power module PM, a sensor module SM, and a current control module CCM.

The display panel DP is any one panel selected from among a liquid crystal display (LCD) panel, an organic luminescent display (OLED) panel, or an electro-wetting display panel, etc. Hereinafter, in the present embodiment, the display panel DP is assumed an organic luminescent display panel, but the present disclosure is not limited thereto.

The power module PM supplies electric power to the display panel DP. For example, the power module PM applies a driving voltage for driving pixels to the display panel DP. The display panel DP displays an image using the electric power supplied from the power module PM.

The sensor module SM is disposed close to the display panel DP. In one embodiment, the sensor module SM includes a temperature sensor capable of sensing the temperature of the display panel DP. In one embodiment, the sensor module SM includes a current measurement sensor (for example, current transducer) capable of detecting the amount of current that the display receives from the power module PM. In one embodiment, the current measurement sensor measures the total amount of current in a manner that calculates the sum of the per-frame current amount for a predetermined period of time.

The current control module CCM electrically connects the display panel DP and the power module PM. In one embodiment, the current control module CCM changes the position at which the display panel DP is supplied with electric power from the power module PM according to the temperature or the amount of current detected by the sensor module SM.

FIG. 19 is a block diagram illustrating some components of the display device DD. Other components of the display device DD, which are not illustrated in FIG. 19, will be described with reference to FIG. 20.

Figure 20:
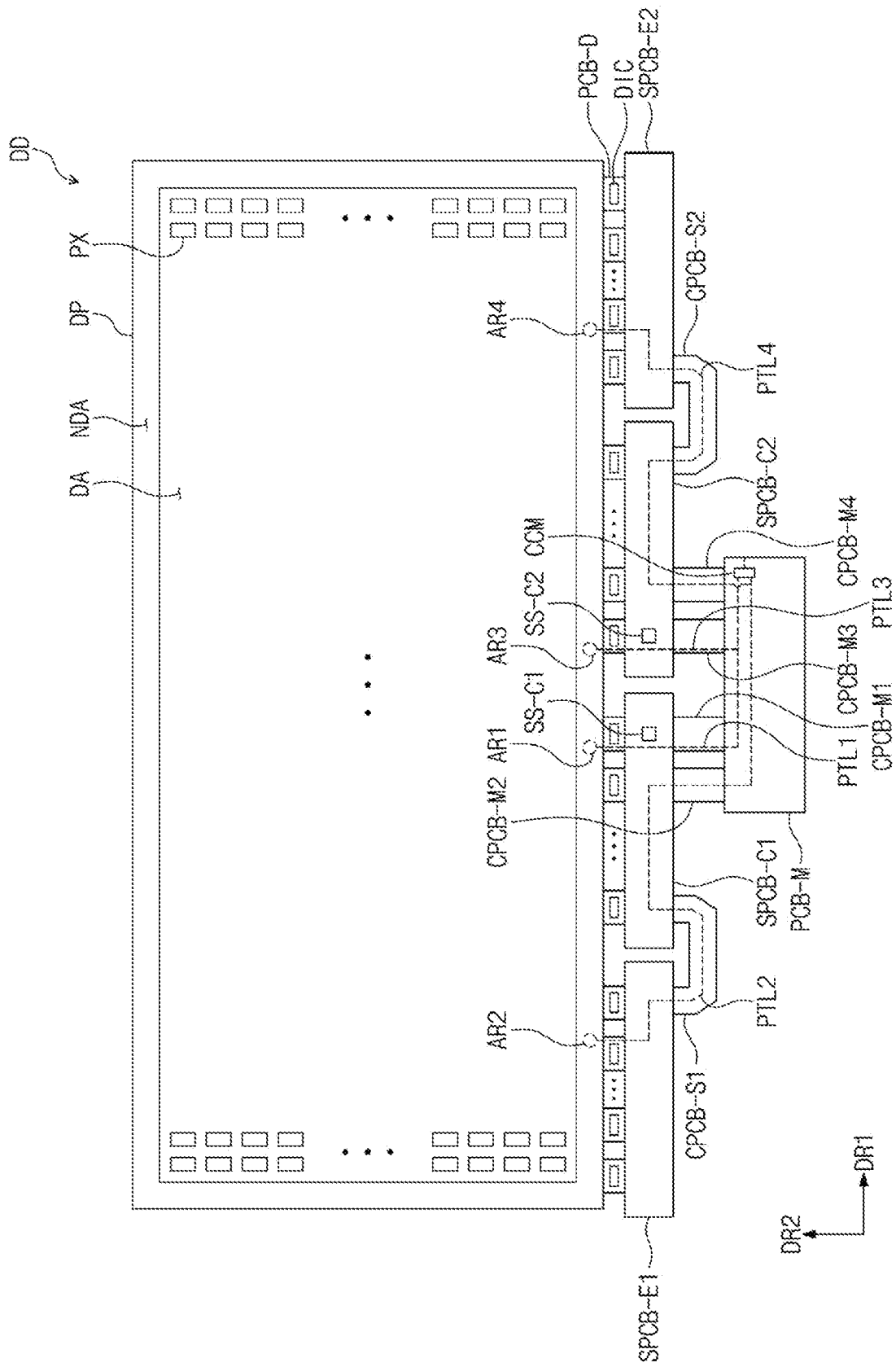
FIG. 20 is a diagram schematically illustrating a display device according to one exemplary embodiment.
Figure 21:
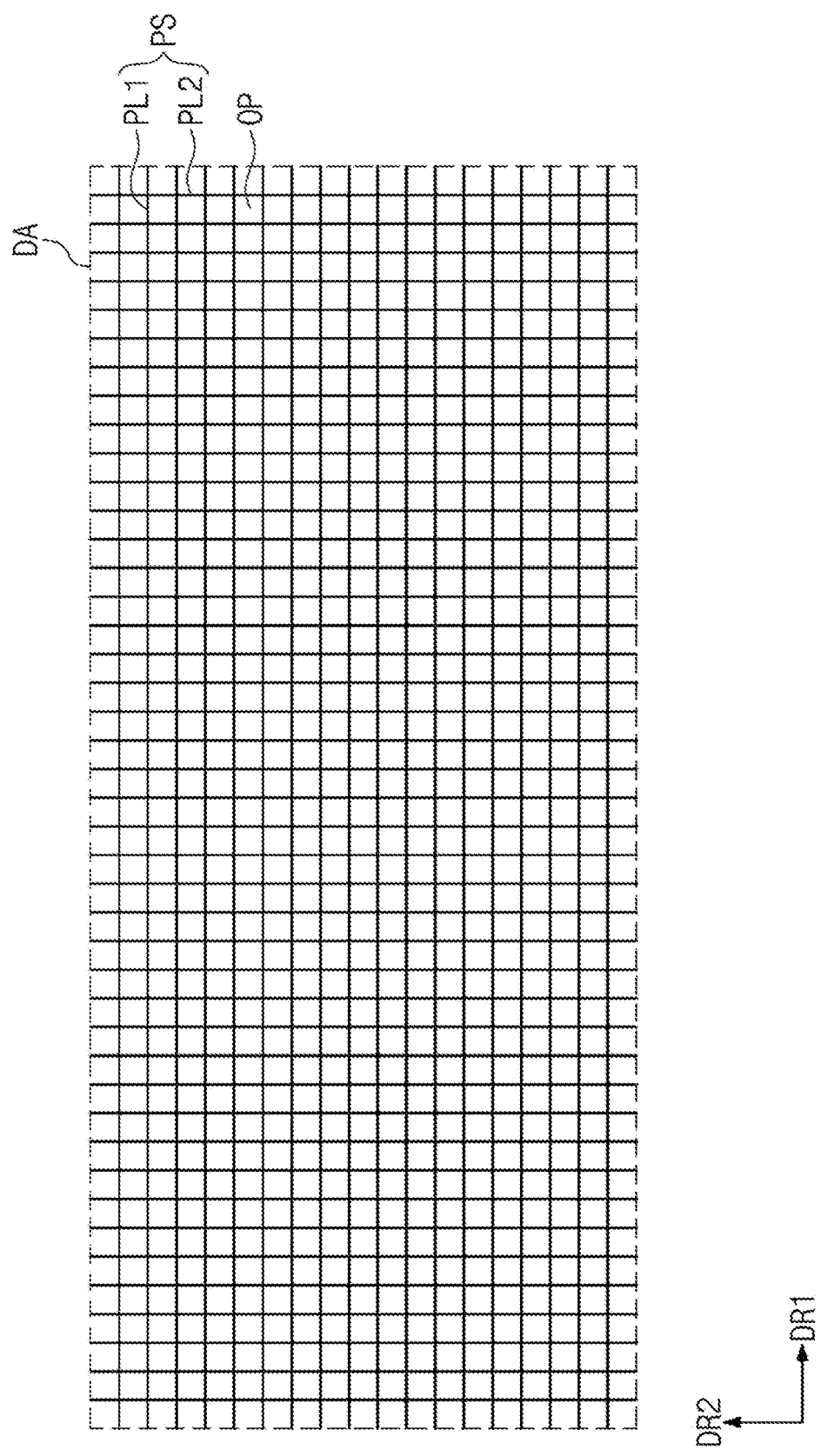
FIG. 21 is a diagram schematically illustrating a power supply member PS according to one exemplary embodiment.

FIG. 20 schematically illustrates a display device DD according to one exemplary embodiment. FIG. 21 schematically illustrates a power supply member PS according to one exemplary embodiment.

In one embodiment, the display device DD includes a display panel DP, multiple data circuit boards PCB-D, multiple data driving circuits DIC, a main circuit board PCB-M, multiple center circuit boards SPCB-C1 and SPCB-C2, multiple edge circuit boards SPCB-E1 and SPCB-E2, multiple main connection circuit boards CPCB-M1 and CPCB-M2, CPCB-M3 and CPCB-M4, multiple sub-connection circuit boards CPCB-S1 and CPBC-S2, power transfer lines PTL1, PTL2, PTL3 and PTL4, a sensor module SM (see FIG. 19), and a current control module CCM. In one embodiment, the sensor module SM (see FIG. 19) includes a first center sensor SS-C1 and a second center sensor SS-C2.

The display panel DP has a display region DA and a non-display region NDA.

The display region DA is parallel to a plane defined with a first direction DR1 and a second direction DR2.

The shape of the display region DA illustrated in FIG. 20 is exemplary, and the shape of the display region DA may vary without any limitation.

The non-display region NDA is an area which is adjacent to the display region DA and within which no image is displayed. A bezel region of the display device DD can be defined by the non-display region NDA. The non-display region NDA is a periphery area surrounding the display region DA. However, but the shapes of the display region DA and the non-display region NDA are not limited thereto and are relatively determined.

Referring to FIGS. 20 and 21, the display panel DP includes a plurality of pixels PX and a power supply member PS. The pixels PX are arranged within the display region DA of the display panel DP. At least a portion of the power supply member PS is arranged within the display region DA of the display panel DP. In FIG. 21, of the entire area of the power supply member, only a portion disposed within the display region DA is illustrated. However, a portion of the power supply member PS may be disposed within the non-display region NDA.

The power supply member PS transfers electric power to the pixels PX. The pixels PX emit light by receiving electric power from the power supply member PS.

The power supply member PS includes a plurality of first power supply lines PL1 and a plurality of second power supply lines PL2. The first power supply lines PL1 and the second power supply lines PL2 are electrically connected to each other.

Each of the first power supply lines PL1 extends in a first direction DR1. The first power supply lines PL1 are arranged in a second direction DR2.

Each of the second power supply lines PL2 extends in the second direction DR2. The second power supply lines PL2 are arranged in the first direction DR1.

A plurality of openings OP is defined between the first power supply lines PL1 and the second power supply lines PL2.

Several data circuit boards of the multiple data circuit boards PCB-D electrically connect the display panel DP with the center circuit boards SPCB-C1 and SPCB-C2, while the others electrically connect the display panel DP with the edge circuit boards SPCB-E1 and SPCB-E2.

The data driving circuits DIC are mounted on the data circuit boards PCB-D, respectively. The data driving circuits DIC supply data signals to the pixels PX.

In one embodiment, the main circuit board PCB-M is a substrate on which components for receiving an electrical signal or electric power that is externally supplied and for transmitting the received electrical signal or electric power to the display panel DP are mounted. For example, the main circuit board PCB-M may be equipped with a control circuit (not illustrated) for controlling electrical signals to be supplied to the display panel DP. The main circuit board PCB-M is provided with a current control module CCM for controlling the electric power to be supplied to the display panel DP. In FIG. 20, the current control module CCM is mounted on the main circuit board PCB-M. However, the position at which the current control module CCM is disposed is not limited thereto.

The center circuit boards SPCB-C1 and SPCB-C2 include a first center circuit board SPCB-C1 and a second center circuit board SPCB-C2.

The distance between each of the center circuit boards SPCB-C1 and SPCB-C2 and the display panel DP is shorter than the distance between the main circuit board PCB-M and the display panel DP.

The edge circuit boards SPCB-E1 and SPCB-E2 include a first edge circuit board SPCB-E1 and a second edge circuit board SPCB-E2.

The center circuit boards SPCB-C1 and SPCB-C2 and the edge circuit boards SPCB-E1 and SPCB-E2 are arranged in the first direction DR1. The center circuit boards SPCB-C1 and SPCB-C2 are disposed between the first edge circuit board SPCB-E1 and the second edge circuit board SPCB-E2 on the first direction DR1.

In one embodiment, the distance between each of the center circuit board SPCB-C1 and SPCB-C2 and the main circuit board PCB-M is shorter than the distance between each of the edge circuit boards SPCB-E1 and SPCB-E2 and the main circuit board PCB-M.

The main connection circuit boards CPCB-M1, CPCB-M2, CPCB-M3, and CPCB-M4 include a first main connection circuit board CPCB-M1, a second main connection circuit board CPCB-M2, a third main connection circuit board CPCB-M3, and a fourth main connection data circuit board CPCB-M4. The first main connection circuit board CPCB-M1 and the second main connection circuit board CPCB-M2 are disposed adjacent to each other, and the third main connection circuit board CPCB-M3 and the fourth main connection circuit board CPCB-M4 are disposed adjacent to each other.

The main connection circuit boards CPCB-M1, CPCB-M2, CPCB-M3, and CPCB-M4 electrically connect the main circuit board PCB-M with the center circuit boards SPCB-C1 and SPCB-C2.

Specifically, the first main connection circuit board CPCB-M1 and the second main connection circuit board CPCB-M2 electrically connect the main circuit board PCB-M and the first center circuit board SPCB-C1. The third main connection circuit board CPCB-M3 and the fourth main connection circuit board CPCB-M4 electrically connect the main circuit board PCB-M and the second center circuit board SPCB-C2.

The sub-connection circuit boards CPCB-S1 and SPCB-E2 include a first sub-connection circuit board CPCB-S1 and a second sub-connection circuit board SPCB-E2.

The first sub-connection circuit board CPCB-S1 electrically connects the first center circuit boards SPCB-C1 and the first edge circuit board SPCB-E1. The second sub-connection circuit board CPCB-S2 electrically connects the second center circuit board SPCB-C2 and the second edge circuit board SPCB-E2.

The power transfer lines PTL1, PTL2, PTL3, and PTL4 include a first power transfer line PTL1, a second power transfer line PTL2, a third power transfer line PTL3, and a fourth power transfer line PTL4.

The power transfer lines PTL1, PTL2, PTL3, and PTL4 transfer electric power received by the power module PM to the power supply member PS.

The first power transfer line PTL1 may transfer the electric power to a first portion AR1 of the power supply member PS. The second power transfer line PTL2 transfers electric power to a second portion AR2 of the power supply member PS. The third power transfer line PTL3 transfers electric power to a third portion AR3 of the power supply member PS. The fourth power transfer line PTL4 transfers the electric power to a fourth portion AR4 of the power supply member PS.

In one embodiment, the first power transfer line PTL1 is disposed on the main circuit board PCB-M, the first main connection circuit board CPCB-M1, and the first center circuit board SPCB-C1.

In one embodiment, the second power transfer line PTL2 is disposed on the main circuit board PCB-M, the second main connection circuit board CPCB-M2, the first center circuit board SPCB-C1, the first sub-connection circuit board CPCB-S1, and the first edge circuit board SPCB-E1.

In one embodiment, the third power transfer line PTL3 is disposed on the main circuit board PCB-M, the third main connection circuit board CPCB-M3, and the second center circuit board SPCB-C2.

In one embodiment, the fourth power transfer line PTL4 is disposed on the main circuit board PCB-M, the fourth connection circuit board CPCB-M4, the second center circuit board CPCB-C2, the second sub-connection circuit board CPCB-S2, and the second edge circuit board SPCB-E2.

However, the positions at which the power transfer lines PTL1, PTL2, PTL3, and PTL4 are disposed are not limited thereto, and the positions may be determined such that the power transfer lines can transfer electric power to different portions of the power supply member PS, respectively.

The first center sensor SS-C1 is disposed on the first center circuit board SPCB-C1. The second center sensor SS-C2 is disposed on the second center circuit board SPCB-C2.

In one embodiment, each of the first center sensor SS-C1 and the second center sensor SS-C2 is a temperature sensor capable of measuring a temperature.

In one embodiment, the first center sensor SS-C1 is a current measurement sensor that measures the amount of current corresponding to the electric power supplied to the power supply member PS through the first power transfer line PTL1. The second center sensor SS-C2 is a current measurement sensor that measures the amount of current corresponding to the electric power supplied to the power supply member PS through the third power transfer line PTL3.

In one embodiment, one of the first center sensor SS-C1 and the second center sensor SS-C2 may be optional.

Figure 22:
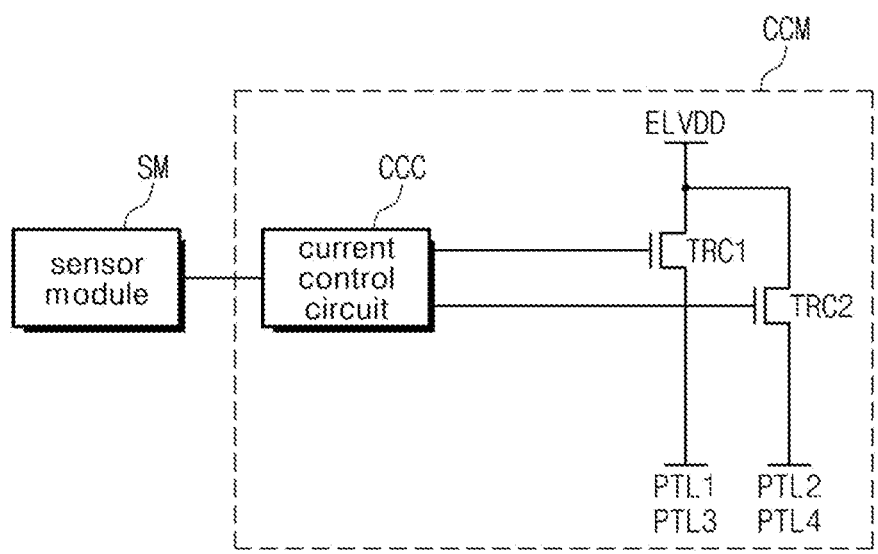
FIG. 22 is a block diagram schematically illustrating a current control module according to one exemplary embodiment.

FIG. 22 is a block diagram schematically illustrating a current control module CCM according to one exemplary embodiment.

The current control module CCM includes a current control circuit CCC, a first control transistor TRC1, and a second control transistor TRC2.

The current control circuit CCC receives an electrical signal corresponding to the information measured by the sensor module SM and selectively turns on either the first control transistor TRC1 or the second control transistor TRC2 according to the received electrical signal.

The first control transistor TRC1 includes a first control electrode, a first input electrode, and a first output electrode. The first control electrode is electrically connected to the current control circuit CCC. The first input electrode receives electric power from the power module PM, and the first output electrode supplies the electric power received through the first input electrode to the power supply member PS. That is, when the first control transistor TRC1 turns on, the first control transistor TRC1 transfers a first power supply voltage ELVDD to the first power transfer line PTL1 and the third power transfer line PTL3.

The second control transistor TRC2 includes a second control electrode, a second input electrode, and a second output electrode. The second control electrode is electrically connected to the current control circuit CCC. The second input electrode receives electric power from the power module PM, and the second output electrode supplies the electric power received through the second input electrode to the power supply member PS. That is, when the second control transistor TRC2 turns on, the second control transistor TRC2 transfers the first power supply voltage ELVDD to the second power transfer line PTL2 and the fourth power transfer line PTL4.

Figure 23:
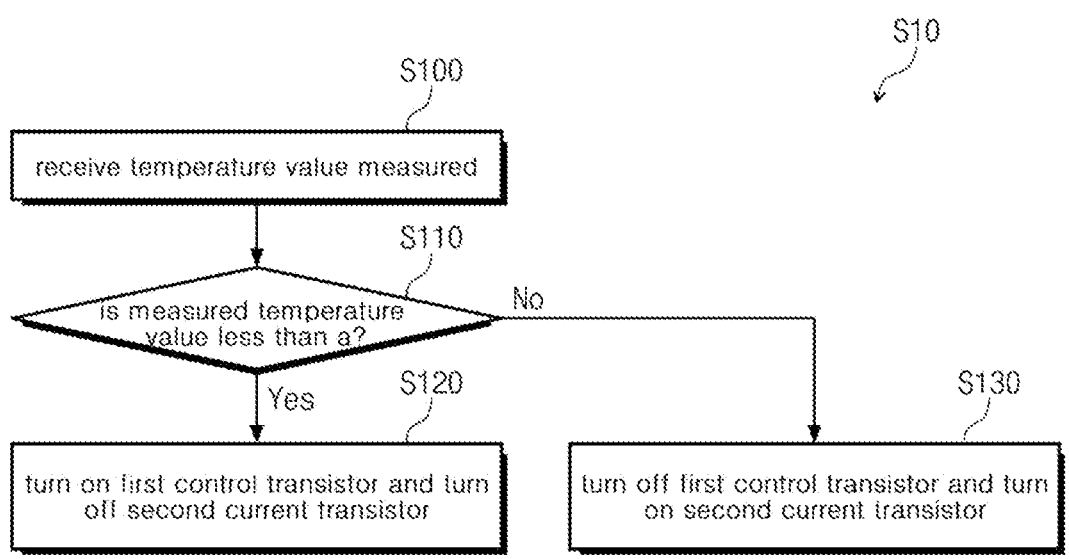
FIG. 23 is a flowchart illustrating exemplary operation steps performed by a current control module when a first center sensor and a second center sensor are temperature sensors.
Figure 24:
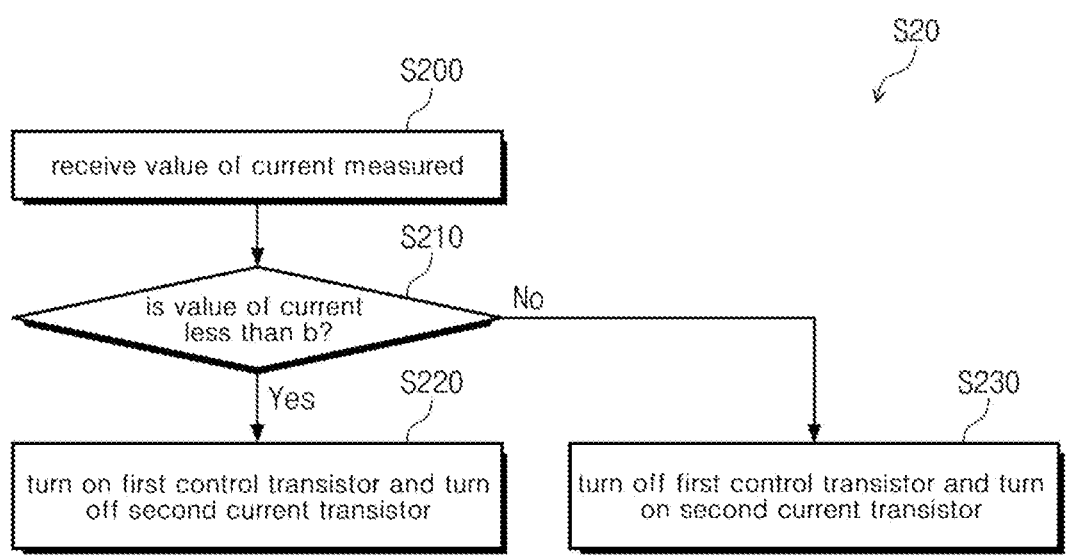
FIG. 24 is a flowchart illustrating exemplary steps performed by the current control module when the first and second center sensors are current measurement sensors (for example, current transducers)
Figure 25:
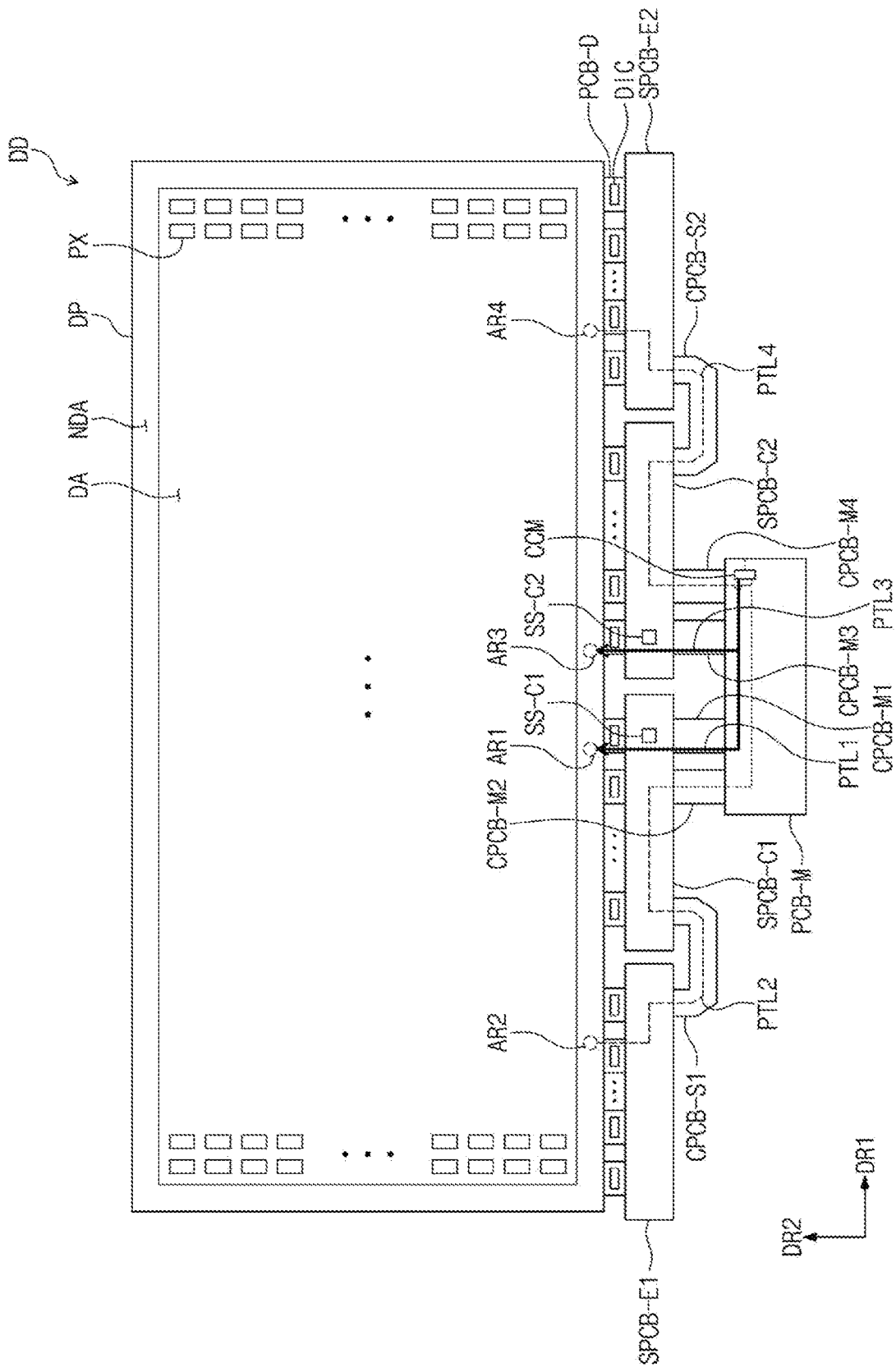
FIG. 25 is a diagram illustrating a state in which a display panel according to one embodiment is supplied with electric power through a first portion and a third portion of a power supply member.
Figure 26:
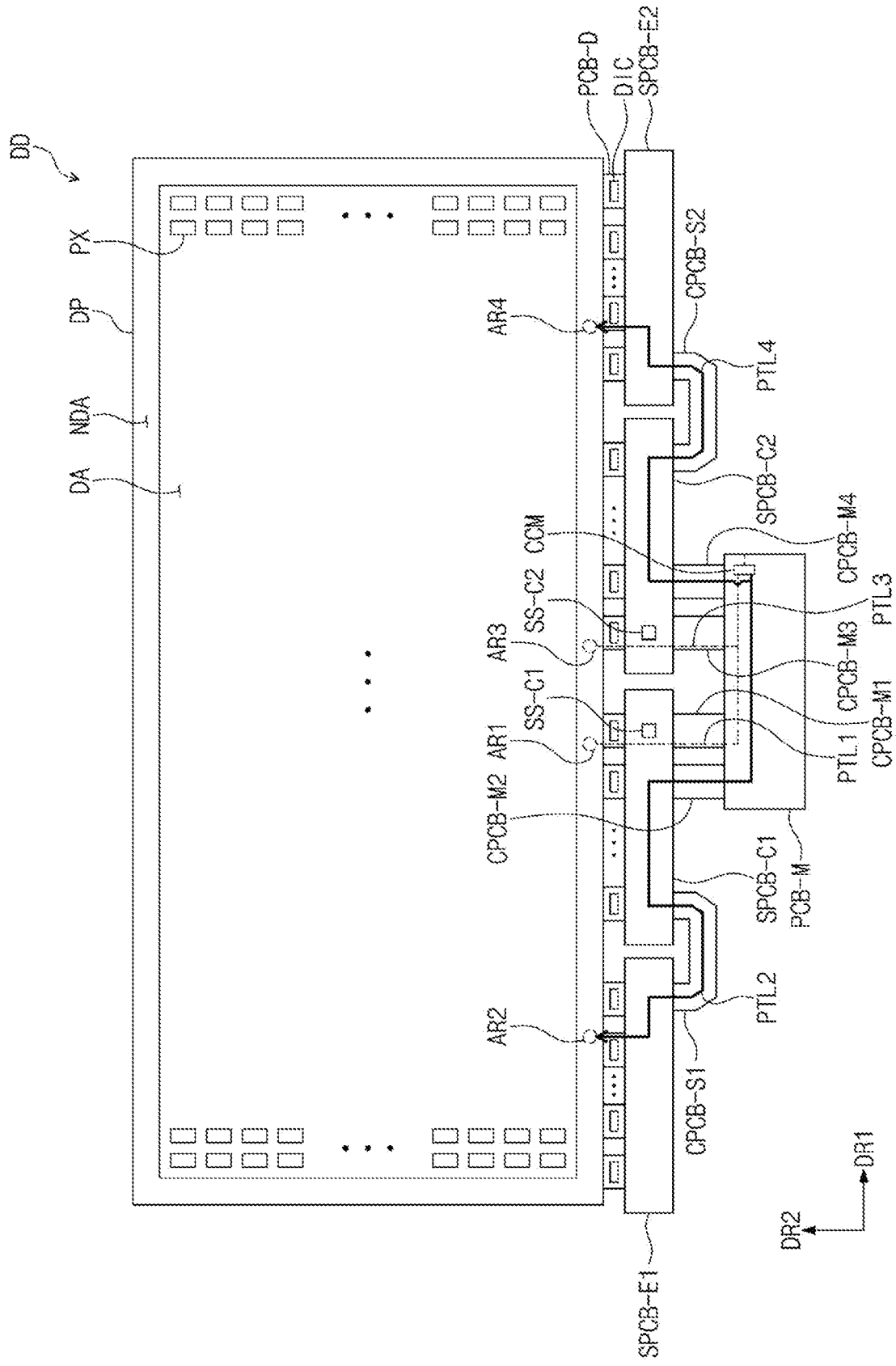
FIG. 26 is a diagram illustrating a state in which a display panel according to one embodiment is supplied with electric power through a second portion and a fourth portion of a power supply member.

FIG. 23 is a flowchart illustrating exemplary operation steps performed by the current control module CCM when the first center sensor SS-C1 and the second center sensor are SS-C2 are temperature sensors. FIG. 24 is a flowchart illustrating exemplary operation steps performed by the current control module when the first center sensor SS-C1 and second center sensor SS-C2 are current measurement sensors (for example, current transducers). FIG. 25 illustrates an example in which the display panel DP is supplied with electric power (or the first power supply voltage ELVDD) through the first portion AR1 and the third portion AR3 of the power supply member PS. FIG. 26 illustrates an example in which the display panel DP is supplied with electric power (or the first power supply voltage ELVDD) through the second portion AR2 and the fourth portion AR4 of the power supply member PS.

Referring to FIG. 23, the operation steps S10 performed by the current control module CCM include a temperature value receiving step S100, a temperature value comparison step S110, a first temperature regulation step S120, and a second temperature regulation step S130.

In the temperature value receiving step S100, the current control circuit CCC receives electrical signals corresponding to the temperature values of the display panel DP, which are measured by the first center sensor SS-C1 and the second center sensor SS-C2.

In the temperature value comparison step S110, the current control circuit CCC determines whether the temperature values of the display panel DP are less than a predetermined value "a" on the basis of the electrical signals.

When the temperature values of the display panel DP are less than the predetermined value "a," the first temperature regulation step S120 is performed. In the first temperature regulation step S120, the first control transistor TRC1 turns on and the second control transistor TRC2 turns off. Thus, as illustrated in FIG. 25, the first portion AR1 and the third portion AR3 of the power supply member PS receive electric power through the first power transfer line PTL1 and the third power transfer line PTL3.

When the temperature values of the display panel DP are equal to or greater than the predetermined value "a," the second temperature regulation step S130 is performed. In the second temperature regulation step S130, the first control transistor TRC1 turns off and the second control transistor TRC2 turns on. Thus, as illustrated in FIG. 26, the second portion AR2 and the fourth portion AR4 of the power supply member PS receive electric power through the second power transfer line PTL2 and the fourth power transfer line PTL4.

According to one embodiment, when the temperature values of a center portion of the display panel DP, which are measured by the first center sensor SS-C1 and the second center sensor SS-C2, are less than the predetermined value "a," the electric power is supplied to the center portion of the display panel DP. On the contrary, when the temperature values of the center portion are equal to or greater than the predetermined value "a," the electric power is supplied to an edge portion of the display panel PD. This prevents the display panel DP from locally overheating, thereby preventing the pixels PX in a specific portion of the display panel DP from being deteriorated and enabling the display device DD to maintain uniform display quality over the entire display region DA thereof.

Referring to FIG. 24, the operation steps S20 performed by the current control module CCM include a current value receiving step S200, a current value comparison step S210, a first temperature regulation step S220, and a second temperature regulation step S230.

In the current value receiving step S200, electrical signals corresponding to the current values received by the power supply member PS through the first power transfer line PTL1 and the third power transfer line PTL3 are obtained from the first center sensor SS-C1 and the second center sensor SS-C2.

In the current value comparison step S210, the current control circuit CCC determines whether the current values measured by the first center sensor SS-C1 and the second center sensor SS-C2 are less than a predetermined value "b."

When the measured current values are less than the predetermined value "b," the first temperature regulation step S220 is performed. In the first temperature regulation step S220, the first control transistor TRC1 turns on and the second control transistor TRC2 turns off. Thus, as illustrated in FIG. 25, the first portion AR1 and the third portion AR3 of the power supply member PS receive electric power through the first power transfer line PTL1 and the third power transfer line PTL3.

When the measured current values are equal to or greater than the predetermined value "b," the second temperature regulation step S230 is performed. In the second temperature regulation step S230, the first control transistor TRC1 turns off and the second control transistor TRC2 turns on. Thus, as illustrated in FIG. 26, the second portion AR2 and the fourth portion AR4 of the power supply member PS receive electric power through the second power transfer line PTL2 and the fourth power transfer line PTL4.

According to one embodiment, when the current values measured by the first center sensor SS-C1 and the second center sensor SS-C2 are less than the predetermined value "b," electric power is supplied to the center portion of the display panel DP. When the measured current values is greater than or equal to the predetermined value "b," electric power is supplied to the edge portion of the display panel DP. This temperature control method prevents the display panel DP from locally overheating by preventing an excessive current from flowing to a specific portion of the display panel DP. Consequently, it is possible to prevent the pixels PX from being deteriorated, and thus enabling the display device DD to maintain uniform display quality over the entire display region DA thereof.

Figure 27:
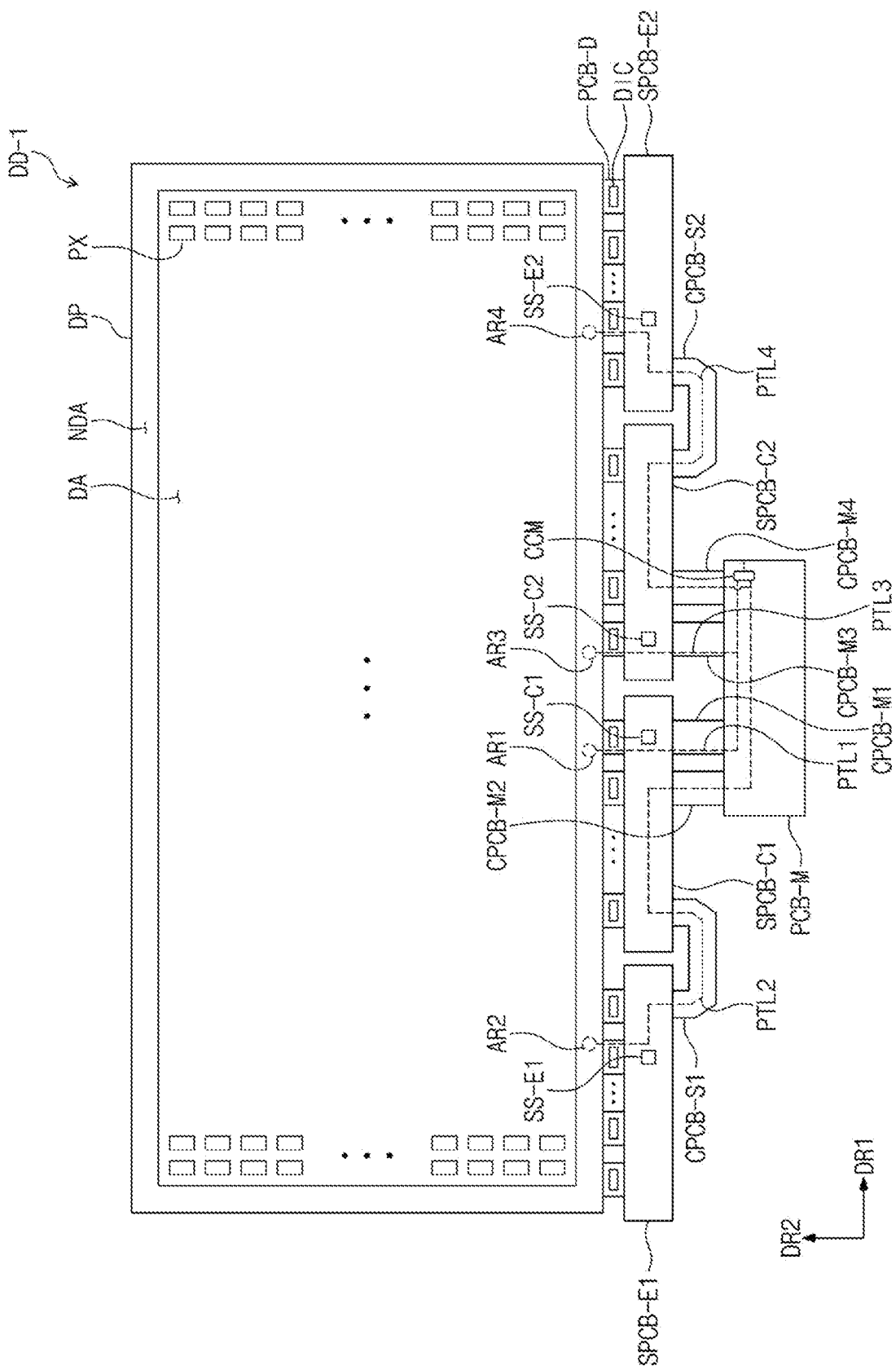
FIG. 27 is a diagram schematically illustrating a display device according to one exemplary embodiment.

FIG. 27 schematically illustrates a display device DD-1 according to one exemplary embodiment.

The display device DD-1 illustrated in FIG. 27 additionally includes a first edge sensor SS-E1 and a second edge sensor SS-E2 in comparison with the display device DD illustrated in FIG. 20.

The first edge sensor SS-E1 is disposed on the first edge circuit board SPCB-E1. The second edge sensor SS-E2 is disposed on the second edge circuit board SPCB-E2.

In one embodiment, each of the first edge sensor SS-E1 and the second edge sensor SS-E2 is a temperature sensor capable of measuring a temperature.

In one embodiment, the first edge sensor SS-E1 is a current measurement sensor that measures the amount of current corresponding to the electric power supplied to the power supply member PS through the second power transfer line PTL2. Next, the second edge sensor SS-E2 is a current measurement sensor that measures the amount of current corresponding to the electric power supplied to the power supply member PS through the fourth power transfer line PTL4.

In one embodiment, one of the first edge sensor SS-E1 and the second edge sensor SS-E2 may be optional.

Figure 28:
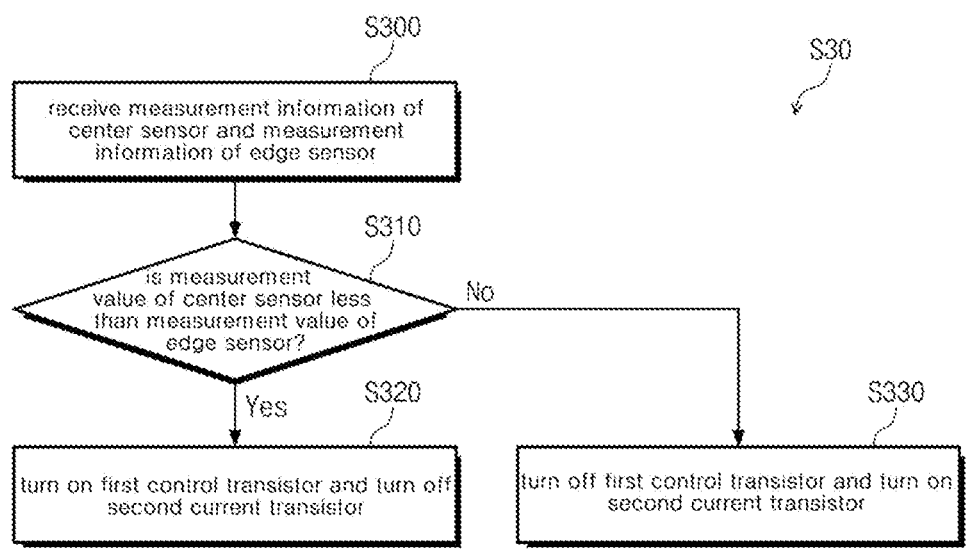
FIG. 28 is a flowchart illustrating an exemplary operation step performed by a current control module illustrated in FIG. 27.

FIG. 28 is a flowchart illustrating an exemplary operation step 30 performed by the current control module CCM illustrated in FIG. 27.

The operation steps S30 performed by the current control module CCM includes a sensor measurement information receiving step S300, a measurement value comparison step S310, a first temperature regulation step S320, and a second temperature regulation step S330.

In the sensor measurement information receiving step S300, the current control circuit CCC receives an electrical signal corresponding to the information measured by each of the first center sensor SS-C1, the second center sensor SS-C2, the first edge sensor SS-E1, and the second edge sensor SS-E2.

In the measurement value comparison step S310, the current control circuit CCC determines whether the measurement value (temperature value or current amount) measured by the center sensors SS-C1 and SS-C2 is less than the measurement value (temperature value or current amount) measured by the edge sensors SS-E1 and SS-E2, on the basis of the received electrical signal.

When the measurement values measured by the center sensors SS-C1 and SS-C2 are less than the measurement values measured by the edge sensors SS-E1 and SS-E2, the first temperature regulation step S320 is performed. The first temperature regulation step S320 of FIG. 28 is substantially the same as the first temperature regulation step S120 of FIG. 23 and the first temperature regulation step S220 of FIG. 24. Therefore, the first temperature regulation step S320 will be redundantly described herein.

When the measurement values measured by the center sensors SS-C1 and SS-C2 are greater than or equal to the measurement values measured by the edge sensors SS-E1 and SS-E2, the second temperature regulation step S230 is performed. Since the second temperature regulation step S330 of FIG. 28 is substantially the same as the second temperature regulation step S130 of FIG. 23 and the second temperature regulation step S230 of FIG. 24, the second temperature regulation step S330 will not be redundantly described herein.

Figure 29:
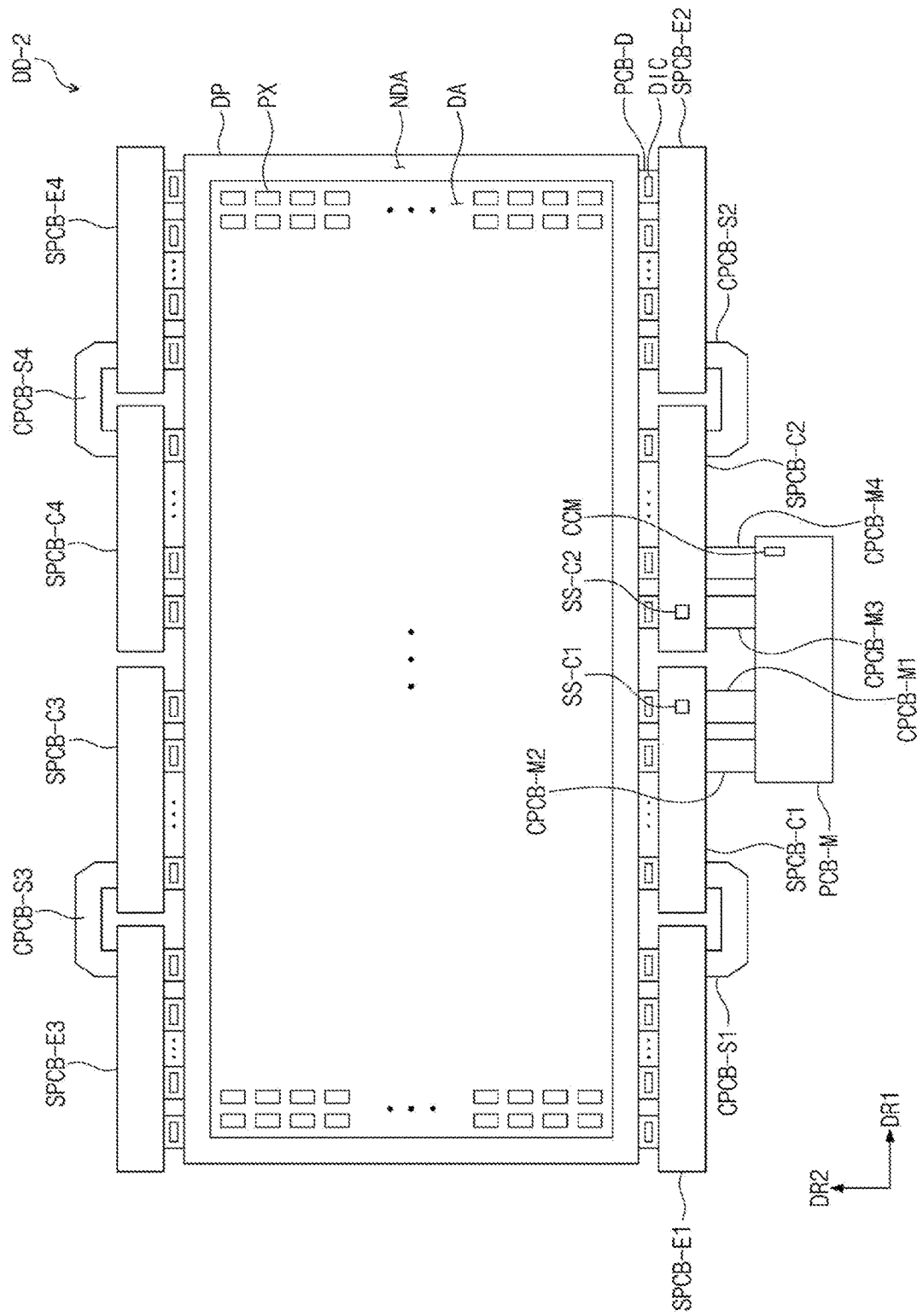
FIG. 29 is a diagram schematically illustrating a display device according to one exemplary embodiment.

FIG. 29 schematically illustrates a display device DD-2 according to one exemplary embodiment.

The display device DD-2 illustrated in FIG. 29 additionally includes a third center circuit board SPCB-C3, a fourth center circuit board SPCB-C4, a third edge circuit board SPCB-E3, a fourth edge circuit board SPCB-E4, a third sub-connection circuit board CPCB-S3, and a fourth sub-connection circuit board CPCB-S4 compared to the display device DD illustrated in FIG. 20.

The third sub-connection circuit board CPCB-S3 electrically connects the third center circuit board SPCB-C3 and the third edge circuit board SPCB-E3 to each other. The fourth sub-connection circuit board CPCB-S4 electrically connects the fourth center circuit board SPCB-C4 and the fourth edge circuit board SPCB-E4.

The third center circuit board SPCB-C3, the fourth center circuit board SPCB-C4, the third edge circuit board SPCB-E3, the fourth edge circuit board SPCB-E4, the third sub-connection circuit board CPCB-S3, and the fourth sub-connection circuit board CPCB-S4 are disposed adjacent to an upper portion (or first side) of the display panel DP, and the first center circuit board SPCB-C1, the second center circuit board SPCB-C2, the first edge circuit board SPCB-E1, the second edge circuit board SPCB-E2, the first sub-connection circuit board CPCB-S1, and the second sub-connection circuit board CPCB-S2 are disposed adjacent to a lower portion of the display panel DP.

In one embodiment, when the temperature values of the lower portion of the display panel DP measured by the first center sensor SS-C1 and the second center sensor SS-C2 are less than a predetermined value, the power supply member PS of the display panel DP receives power at the lower portion of the display panel DP. When the temperature values of the lower portion of the display panel DP measured by the first center sensor SS-C1 and the second center sensor SS-C2 are greater than or equal to the predetermined value, the power supply member PS of the display panel DP receives power at the upper portion of the display panel.

As described above, the display device according to the second embodiment does not locally overheat, thereby preventing the light-emitting elements in the display panel from being deteriorated. In addition, it is possible to provide a display device providing uniform display quality over the entire area of the display panel by preventing the display panel from locally overheating. By changing a portion to which the pixel driving voltage is applied in the display panel, it is possible to suppress the display from overheating, thereby providing a display device providing improved display quality.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
a display panel having a display region and a non-display region at a periphery portion of the display region; and
a main circuit board configured to transfer a power supply voltage to the display panel,
wherein the display panel includes a plurality of pixels and a power supply circuit electrically connected to the pixels,
wherein the power supply circuit includes:
a plurality of first power lines, each extending in a first direction,
a plurality of second power lines, each extending in a second direction, intersecting the first direction, the second power lines being electrically connected to the first power lines,
a first portion having a first density of either the first power lines or the second power lines or both, the first portion spaced apart from the main circuit board by a first distance, and
a second portion having a second density of either the first power lines or the second power lines or both, the second portion spaced apart from the main circuit board by a second distance,
wherein the second distance is longer than the first distance, and
wherein the second density is greater than the first density.

2. The display device according to claim 1, wherein at least a portion of the power supply circuit overlaps the display region of the display panel.

3. The display device according to claim 2, wherein each of the plurality of pixels includes a light-emitting element, and the power supply circuit supplies the power supply voltage to the light-emitting element.

4. The display device according to claim 3, wherein the plurality of first power lines includes:
a first line having a first length, the first line being spaced from the main circuit board by a third distance; and
a second line having a second length, the second line being spaced from the main circuit board by a fourth distance,
wherein the second length of the second line is longer than the first length of the first line, and
wherein the fourth distance is longer than the third distance.

5. The display device according to claim 3, wherein a length of each of the first power lines gradually increases or decreases based on a distance from the main circuit board.

6. The display device according to claim 3, wherein a plurality of openings is within the power supply circuit, and the plurality of openings includes:

a first opening having a first size, the first opening being spaced apart from the main circuit board by a fifth distance, and a second opening having a second size, the second opening being spaced apart from the main circuit board by a sixth distance, wherein the sixth distance is longer than the fifth distance.

7. The display device according to claim 3, wherein a plurality of openings is within the power supply circuit, and a size of each of the openings gradually increases or decreases based on a distance from the main circuit board.

8. The display device according to claim 1, further comprising a plurality of data circuit boards disposed on one side of the display panel, the plurality of data circuit boards connected with the main circuit board electrically, wherein the power supply voltage supplied by the main circuit board is transferred to the display panel through at least one data circuit board of the plurality of data circuit boards.

9. A display device comprising:

a display panel including a display region, a non-display region at a periphery portion of the display region, a plurality of pixels, and a power supply circuit that transfers a power supply voltage to the pixels;

a plurality of data circuit boards, each being disposed on one side of the display panel and being electrically connected to the display panel;

a plurality of data driving circuits, each being mounted on a corresponding one of the plurality of data circuit boards and supplying a data signal to the plurality of pixels;

a plurality of sub-circuit boards, each electrically connected to a corresponding one of the plurality of data circuit boards; and a main circuit board supplying the power supply voltage to the power supply circuit through at least one of the plurality of sub-circuit boards and at least one of the plurality of data circuit boards, wherein the plurality of data circuit boards includes:

a first data circuit board spaced from the main circuit board by a first distance and including i pads supplying the power supply voltage received from the main circuit board to the power supply circuit; and a second data circuit board spaced from the main circuit board by a second distance that is shorter than the first distance and including j pads supplying the power supply voltage received from the main circuit board to the power supply circuit, the i being a number greater than the j.

10. The display device according to claim 9, wherein the power supply circuit includes:

a plurality of first power lines each of which extends in a first direction and which is arranged in a second direction intersecting the first direction; and a plurality of second power lines each of which extends in the second direction and which are arranged in the first direction, the second power lines being electrically connected to the first power lines.

11. The display device according to claim 10, wherein at least a portion of the power supply circuit overlaps the display region of the display panel.

12. The display device according to claim 11, wherein the plurality of data circuit boards further includes a third data circuit board, the third data circuit board includes k pads that supply the power supply voltage received from the main circuit board to the power supply circuit, and is spaced from the main circuit board by a third distance shorter than the second distance, and the k is a number smaller than the j.

13. The display device according to claim 12, wherein the plurality of data circuit boards further includes a fourth data circuit board, the fourth data circuit board includes l pads that supply the power supply voltage received from the main circuit board to the power supply circuit, and is spaced from the main circuit board by a fourth distance that is shorter than the third distance, and the l is a number smaller than the k.

14. The display device according to claim 13, wherein the i is 12n, the j is 6n, the k is 4n, and the l is 3n.

15. The display device according to claim 11, wherein each of the plurality of pixels includes a light-emitting element, and the power supply circuit supplies the power supply voltage to the light-emitting element.

16. The display device according to claim 9, further comprising a main connection circuit board electrically connecting a corresponding one of the plurality of sub-circuit boards to the main circuit board, wherein the plurality of sub-circuit boards includes a plurality of edge circuit boards and a plurality of center circuit boards disposed between the plurality of edge circuit boards.

17. The display device according to claim 16, wherein the main connection circuit board electrically connects one of the plurality of center circuit boards to the main circuit board.

18. The display device according to claim 16, wherein the main connection circuit board electrically connects one of the plurality of edge circuit boards to the main circuit board.

* * * * *